(12) United States Patent
Shinriki et al.

(10) Patent No.: US 7,408,225 B2
(45) Date of Patent: Aug. 5, 2008

(54) APPARATUS AND METHOD FOR FORMING THIN FILM USING UPSTREAM AND DOWNSTREAM EXHAUST MECHANISMS

(75) Inventors: Hiroshi Shinriki, Tama (JP); Baiei Kawano, Tama (JP); Akira Shimizu, Tama (JP)

(73) Assignee: ASM Japan K.K., Tokyo (JP)

( * ) Notice: Subject to any disclaimer, the term of this patent is extended or adjusted under 35 U.S.C. 154(b) by 560 days.

(21) Appl. No.: 10/960,600

(22) Filed: Oct. 7, 2004

(65) Prior Publication Data

US 2005/0208217 A1 Sep. 22, 2005

Related U.S. Application Data

(60) Provisional application No. 60/510,059, filed on Oct. 9, 2003.

(51) Int. Cl.
*H01L 23/62* (2006.01)
(52) U.S. Cl. ............... 257/359; 257/682; 257/E21.269; 257/E21.274; 257/E21.302; 257/E21.319
(58) Field of Classification Search ................. 257/359, 257/219, 678, 682, 684, 721, 729
See application file for complete search history.

(56) References Cited

U.S. PATENT DOCUMENTS

| 5,755,878 A * | 5/1998 | Habuka et al. ............... 117/90 |
| 5,938,840 A * | 8/1999 | Habuka et al. .............. 117/200 |
| 2001/0006093 A1* | 7/2001 | Tabuchi et al. .............. 156/345 |
| 2003/0106643 A1* | 6/2003 | Tabuchi et al. ......... 156/345.35 |

* cited by examiner

*Primary Examiner*—David Nhu
(74) *Attorney, Agent, or Firm*—Knobbe, Martens, Olson & Bear LLP

(57) ABSTRACT

A thin-film formation apparatus possesses a reaction chamber to be evacuated, a placing portion on which a substrate is placed inside the reaction chamber, a gas-dispersion guide installed over the placing portion for supplying a gas onto a substrate surface, a gas-supply port for introducing the gas into the gas-dispersion guide, a gas-dispersion plate disposed on the side of the substrate of the gas-dispersion guide and having multiple gas-discharge pores, a first exhaust port for exhausting, downstream of the gas-dispersion plate, the gas supplied onto the substrate surface from the gas-dispersion plate, and a second exhaust port for exhausting, upstream of the gas-dispersion plate, a gas inside the gas-dispersion guide via a space between the gas-dispersion guide and the gas-dispersion plate.

29 Claims, 11 Drawing Sheets

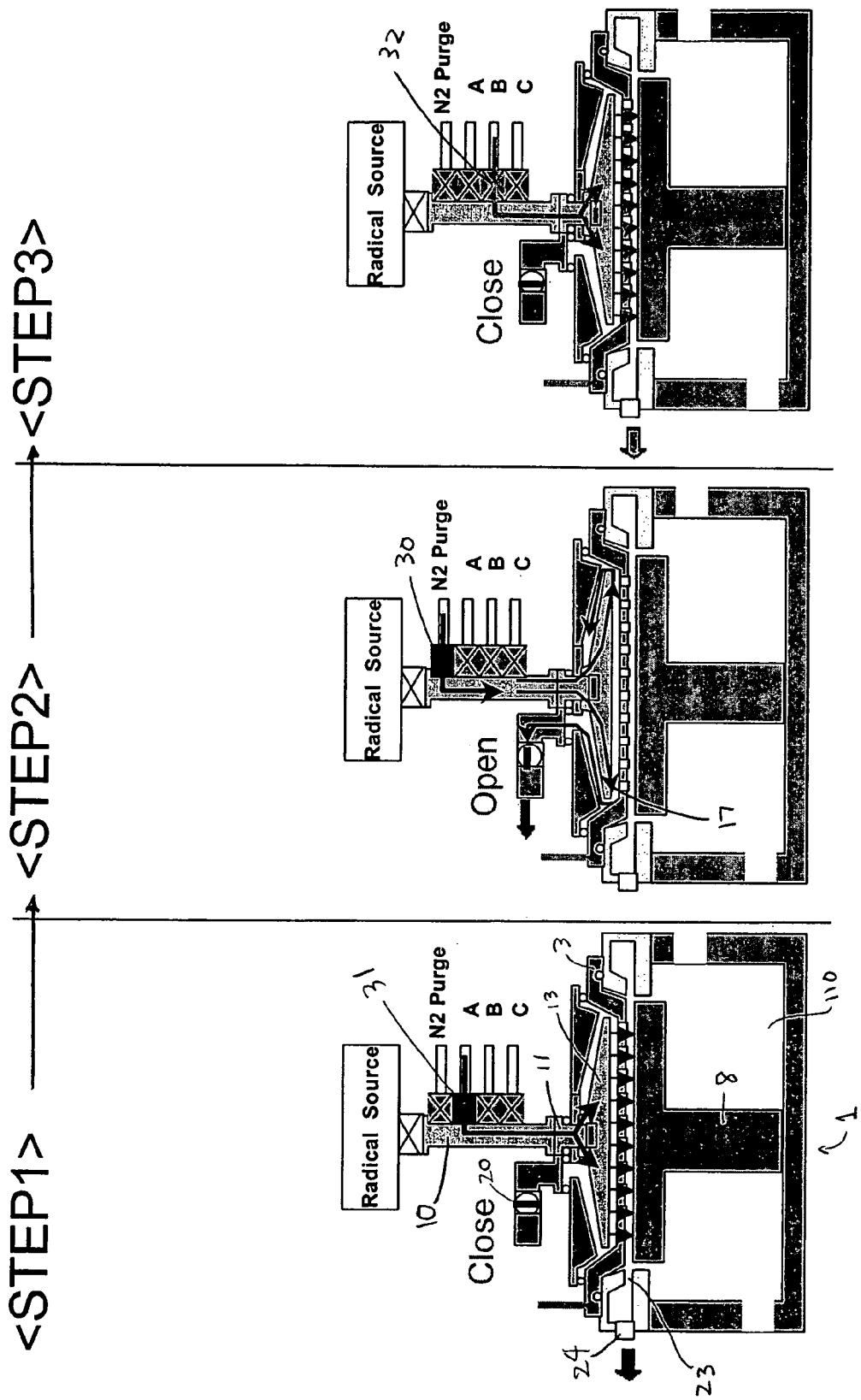

<STEP 4>

APPARATUS AND METHOD FOR FORMING THIN FILM USING UPSTREAM AND DOWNSTREAM EXHAUST MECHANISMS

This application claims the benefit of U.S. Provisional Application No. 60/510,059, filed on Oct. 9, 2003.

BACKGROUND OF THE INVENTION

1. Field of the Invention

The present invention relates to a single-wafer-processing type thin-film formation apparatus and method, which form a thin film on a workpiece, which is a semiconductor wafer, piece by piece.

2. Description of the Related Art

As thin-film formation apparatuses for thin film growth by atomic layer deposition, various types of formation apparatuses have been proposed. As typical examples, there are cases, in which gas is supplied from a gas-dispersion apparatus (i.e., a showerhead) disposed facing a substrate; and cases, in which gas is supplied by forming a laminar flow flowing in a direction from one edge of the substrate to the other edge without using the showerhead. In the case of a showerhead method, source gases can be supplied at uniform gas concentration onto the substrate surface, whereas in the case of a laminar-flow method, gas concentration in the upper stream tends to vary from gas concentration in the down stream. In the showerhead method, in order to supply gas onto the substrate surface uniformly, a source gas is stored inside the showerhead and is supplied onto the substrate using a dispersion plate having a relatively small conductance. For example, after a first gas is supplied, the remaining first gas is exhausted by supplying a second gas, and then a third gas is supplied; if the first gas still remains, solids are formed by a vapor chemical reaction. For this reason, when the third gas is supplied, it becomes necessary to sufficiently eliminate gases remaining in the dispersion apparatus. This conflicts with a primary feature of the showerhead, which stores gas inside it. Consequently, the showerhead method was considered that it was excellent in uniformity, but low in throughput, and other methods without using the showerhead method were more advantageous because exhausting reaction gases was easy.

SUMMARY OF THE INVENTION

One of the merits of the showerhead method, however, is that it can supply a precursor on a substrate with uniform concentration distribution or arbitrary concentration distribution. In order to achieve uniform concentration distribution, controlling conductance in a flow path from the showerhead to the substrate by the dispersion plate is required; this becomes a main cause for impeding reaction gas purge from within the showerhead. In view of this, the inventors of the present invention have devised a method of supplying source gases onto a substrate surface at a uniform source gas concentration; reducing precursor concentration changes in a peripheral portion of the substrate when the gases are exhausted from the center of the showerhead toward its outer perimeter; and particularly, decreasing an impact of purge gas which prevents source gases from diffusing to a lower portion of a substrate-placing stand as well as eliminating source gases from within the showerhead or a reaction chamber in a short amount of time when a first source gas is switched to a second source gas.

In one embodiment, the present invention provides the following thin-film formation apparatus: A thin-film formation apparatus comprising: a reaction chamber to be evacuated; a placing portion on which a substrate is placed inside the reaction chamber; a gas-dispersion guide installed above the placing portion for supplying gas onto a substrate surface; a gas-supply port for introducing gas into the gas-dispersion guide; a gas-dispersion plate disposed on a substrate side of the gas-dispersion guide and having multiple gas-discharge pores; a first exhaust port for exhausting, downstream of the gas-dispersion plate, the gas supplied onto the substrate surface from the gas-dispersion plate (this port may be referred to as "the downstream exhaust port"); and a second exhaust port for exhausting, upstream of the gas-dispersion plate, a gas inside the gas-dispersion guide through a space between the gas-dispersion guide and the gas-dispersion plate (this port may be referred to as "the upstream exhaust port").

Additionally, the present invention includes the following apparatuses, but is not limited to these embodiments:

A thin-film formation apparatus, wherein a first gas flow path is formed by communicatively connecting an internal space of the gas-dispersion guide, a space between the gas-dispersion guide and the gas-dispersion plate (this space and the internal space combined together may be referred to as "the space" between the gas-dispersion guide and the gas-dispersion plate), and a space between the gas-dispersion plate and a substrate with the first exhaust port; a second gas flow path is formed by communicatively connecting the internal space of the gas-dispersion guide, the space between the gas-dispersion guide and the gas-dispersion plate, and a space facing an outer circumferential wall of the gas-dispersion guide with the second exhaust port;

The thin-film formation apparatus, wherein in the second gas flow path, the space between the gas-dispersion guide and the gas-dispersion plate and the space facing the outer circumferential wall of the gas-dispersion guide are communicated with each other via an exhaust pore or an annular exhaust slit provided between an outer circumferential rim of the gas-dispersion guide and an outer circumferential portion of the gas-dispersion plate;

The thin-film formation apparatus, wherein the gas-dispersion guide has a truncated cone shape extending downward and being open at its lower side;

The thin-film formation apparatus, wherein the gas-dispersion guide further comprises an intermediate dispersion element having pores or slits for discharging a gas toward the gas-dispersion plate in the vicinity of the gas-supply port;

The thin-film formation apparatus, wherein a valve connected to an external exhaust system is connected to the second exhaust port;

The thin-film formation apparatus, wherein the valve is a valve having exhaust conductance which is variable at high speed of 100 msec or less;

The thin-film formation apparatus, wherein the valve's minimum conductance is controlled at 1% or less of the valve's maximum conductance;

The thin-film formation apparatus, which is configured to exhaust the gas predominantly from the second gas flow path when the valve's conductance is maximum; and exhaust the gas predominantly from the first gas flow path when the valve's conductance is minimum;

The thin-film formation apparatus, wherein an electrode for applying RF power is further provided in the gas-dispersion plate;

The thin-film formation apparatus, wherein an electrode for applying RF power is further provided on a wall constituting the gas-dispersion guide;

The thin-film formation apparatus, wherein a heating source for heating a gas passing through the gas-dispersion plate is further installed in the gas-dispersion plate;

The thin-film formation apparatus, wherein a heating source for heating a gas inside the gas-dispersion guide is further installed in a wall constituting the gas-dispersion guide;

The thin-film formation apparatus, wherein a temperature of the placing portion on which a substrate is placed is controlled within the range of 50-450° C. (including 100° C., 150° C., 200° C., 300° C., 350° C., 400° C., and values between each value; preferbly 100-400° C.); a temperature of the gas-dispersion plate is controlled at 250° C. or below (including 200° C., 150° C., 100° C., 50° C., and values between each value);

The thin-film formation apparatus, wherein the gas-dispersion guide further comprises an intermediate plate between the gas-dispersion plate and the gas-supply port, wherein the intermediate plate has intermediate gas-discharge pores in positions not overlapping with the gas-discharge pores of the gas-dispersion plate and functions as a second dispersion plate;

The thin-film formation apparatus, wherein the valve is configured to have conductance controlled to be 10 to 1,000 times conductance of the dispersion plate when the valve is opened at maximum; and have conductance of the valve controlled to be 0.001 to 0.1 times (or less than that) conductance of the dispersion plate when conductance of the valve is at minimum;

The thin-film formation apparatus, which is characterized in that a space below the substrate-placing stand and a space above the substrate-placing stand are communicatively connected through a space having a narrow width within a processible range (e.g., approx. 0.5 mm to approx. 1.5 mm) and a long distance (e.g., approx. 10 mm to approx. 30 mm); and which is characterized in that a width and a length of the space are set so that diffusion of a source gas to the space below the placing stand from the space above it is prevented by the space having the narrow width by supplying an inert gas from below the substrate-placing stand;

The thin-film formation apparatus, wherein disposition of the first exhaust port is configured so that it surrounds a side portion of the substrate-placing stand (or the first exhaust port is disposed below an outer circumferential portion of the top surface of the substrate-placing stand), and gas discharged from the gas-dispersion plate passes around the side portion of the substrate-placing stand and is exhausted from the first exhaust port;

The thin-film formation apparatus, which is characterized by being configured so that the first exhaust port is disposed to surround the side portion of the substrate-placing stand, and a width (e.g., approx. 2 mm to approx. 5 mm) of a gas flow path of the first exhaust port, which is located on the side of the substrate-placing stand on the gas-dispersion plate side (or a gas flow path extending from the top surface's outer circumferential portion of the substrate-placing stand to the first exhaust port), is wider than a width (e.g., approx. 0.5 mm to approx. 1.5 mm) of a gas flow path of the first exhaust port, which is located in a lower portion of the substrate-placing stand (or a gas flow path on the side of the substrate-placing stand further down from the first exhaust port); by being configured so that diffusion of source gases to the downward space from the upward space through the upper and lower gas flow paths (upward and downward gas flow paths sandwiching the first exhaust port) is prevented by supplying an inert gas (purge gas) from below the substrate-placing stand and that the purge gas from the downward space does not produce an effect on a substrate being in the upward space (i.e., problems of dilution of the source gas by the purge gas, etc. are decreased) by securing a distance of a gas flow path from an outer circumferential edge of the substrate in the upward space to the first exhaust port (e.g., approx. 10 mm-approx. 45 mm).

The present invention can apply to a method, and according to one embodiment, provide the following method:

A method for forming a thin film comprising the steps of: placing a substrate on a placing portion inside a reaction chamber exhausted; introducing a gas from a gas-supply port to a gas-dispersion guide installed above the placing portion; supplying the gas onto a substrate surface via a gas-dispersion plate being disposed on the substrate side of the gas-dispersion guide and having multiple gas-discharge pores; exhausting the gas supplied from the gas-dispersion plate onto the substrate surface from a first exhaust port downstream of the gas-dispersion plate; and when switching to a subsequent gas to be introduced from the gas-supply port to the gas-dispersion guide, exhausting the gas remaining inside the gas-dispersion guide via a space between the gas-dispersion guide and the gas-dispersion plate from a second exhaust port upstream of the gas-dispersion plate.

Additionally, the present invention includes the following methods, but is not limited to these embodiments:

A method for forming a thin film, wherein the gas-dispersion guide has a truncated cone shape extending downward and being open at a lower side and further comprise an intermediate dispersion element having pores or slits for discharging gas toward the gas-dispersion plate in the vicinity of the gas-supply port, wherein the gas is supplied to the gas-dispersion plate via the intermediate dispersion element;

The method for forming a thin film, wherein a first gas flow path is formed by communicatively connecting an internal space of the gas-dispersion guide, a space between the gas-dispersion guide and the gas-dispersion plate, and a space between the gas-dispersion plate and a substrate with the first exhaust port; a second gas flow path is formed by communicatively connecting the internal space of the gas-dispersion guide, the space between the gas-dispersion guide and the gas-dispersion plate, and a space facing an outer circumferential wall of the gas-dispersion guide with the second exhaust port, wherein exhaust gas volumes from the first exhaust port and the second exhaust port are controlled by changing exhaust conductance of the second gas flow path against exhaust conductance of the first gas flow path;

The method for forming a thin film, wherein in the second gas flow path, the space between the gas-dispersion guide and the gas-dispersion plate and the space facing the outer circumferential wall of the gas-dispersion guide are communicated with each other via an exhaust pore or an annular exhaust slit provided between an outer circumferential rim of the gas-dispersion guide and an outer circumferential portion of the gas-dispersion plate, wherein the second gas flow path is exhausted via the exhaust pores or the annular exhaust slit;

The method for forming a thin film, wherein a purge gas after the gas switching is introduced into the gas-dispersion guide from the gas-supply port substantially simultaneously with start of exhausting gas from the second exhaust port;

The method for forming a thin film, wherein a second source gas after the gas switching is introduced into the gas-dispersion guide from the gas-supply port after exhausting gas from the second exhaust port is nearly completed;

The method for forming a thin film, wherein conductance of the second gas flow path is changed from "Small" to "Large", or "Closed" to "Open" in keeping with the gas switching of a source gas and a purge gas;

The method for forming a thin film, wherein the gas is exhausted predominantly from the second gas flow path by controlling conductance of the second gas flow path to be approx. 10 times to approx. 1,000 times conductance of the first gas flow path; and the gas is exhausted predominantly from the first exhaust port by controlling conductance of the second gas flow path to be approx. 0.001 times to approx. 0.1 times conductance of the first gas flow path;

The method for forming a thin film, wherein the gas switching is executed by varying exhaust conductance at high speed of 100 msec or below;

The method for forming a thin film, wherein exhaust from the second exhaust port is controlled by controlling the minimum conductance of the second gas flow path at 1% or below of the maximum conductance.

The method for forming a thin film, wherein gas discharged from the first gas flow path is exhausted from over the placing stand, and then from the first exhaust port; and an inert gas used for preventing source gas diffusion, which is introduced from a position downward of the placing stand, is exhausted from the first exhaust port along with the side of the placing stand; and at this time, in order to prevent a process gas from diffusing to the lower side of the placing stand and to minimize an impact on the placing stand, the inert gas is adapted to be smoothly exhausted from the first exhaust port;

The method for forming a thin film, wherein the gas-switching process comprises the steps of: (I) when a process gas is introduced as the gas into the gas-dispersion guide, decreasing conductance of the second gas flow path to nearly minimum, thereby exhausting the gas through the first gas flow path passing via the substrate; (II) when a purge gas is introduced as the gas into the gas-dispersion guide, increasing conductance of the second gas flow path to nearly maximum, thereby exhausting the process gas through the second gas flow path not passing via the substrate along with the purge gas; (III) sequentially repeating steps (I) and (II) for subsequent process gases wherein one cycle is completed when all process gases have gone through the substrate; and (IV) repeating the cycle until a thickness of a thin film to be formed on the substrate reaches a given value;

The method for forming a thin film, wherein the time required for one cycle is approx. 0.5 seconds to approx. 3 seconds;

The method for forming a thin film, wherein each cycle is controlled to deposit each atomic layer;

The method for forming a thin film, wherein the gas switching is executed by controlling the minimum conductance (Cpse) of the second gas flow path, conductance of the first gas flow path (Cpde), and the maximum conductance of the second gas flow path (Cse) in the following ratio (Cpse is, for example, 0.1-1, or may be 0):

Cpse:Cpde:Cse=1 or less:5-20:100;

The method for forming a thin film, wherein RF power is applied between the gas-dispersion plate and the placing portion when the gas is supplied onto the substrate;

The method for forming a thin film, wherein RF power is applied between the gas-dispersion guide and the placing portion when the gas is supplied onto the substrate;

The method for forming a thin film, wherein a gas going through the gas-dispersion plate is heated by a heating source provided in the gas-dispersion plate;

The method for forming a thin film, wherein a gas inside the gas-dispersion guide is heated by a heating source provided on a wall comprising the gas-dispersion guide;

The method for forming a thin film, wherein the wall is controlled at a temperature within the range of 50-450° C.; the gas-dispersion plate is controlled at a temperature of 250° C. or below;

The method for forming a thin film, wherein the gas-dispersion guide further comprises an intermediate plate between the gas-dispersion plate and the gas-supply port; and the intermediate plate has intermediate discharge pores in positions not overlapping with the gas-discharge pores in the gas-dispersion plate, wherein the gas is dispersed upstream of the gas-dispersion plate by going through intermediate discharge pores.

In accordance with one embodiment of the thin-film formation apparatus according to the present invention, it becomes possible to supply source gases extremely uniformly by using a showerhead and to eliminate reaction gases remaining inside the showerhead in a short period of time, which were conventionally difficult. For example, by using a high-speed variable-conductance valve powered by a servomotor, it becomes possible to make conductance 2-3 digits variable at a high speed of approx. 50 msec, thereby enabling to achieve purging of remaining gases thoroughly in a short period of time. Additionally, by using a valve which can be opened/closed at a high speed, the same effect can be obtained if long-term reliability of the valve is secured. Consequently, forming uniform films with improved throughput, which was conventionally unthinkable, becomes possible.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

FIG. 2 is a schematic explanatory view showing one example of the film formation process comprising Steps 1, 2

& 3 according to the present invention. These figures are excessively simplified for purposes of illustration. In Step 1, Gas A is supplied, and an exhaust valve (upstream-side exhaust valve) before the gas-dispersion plate is being closed. In Step 2, purge is conducted using N2 gas (1-5 standard liter per minute (SLM)), and the upstream-side exhaust valve (maximum exhaust conductance 38 liter/sec or above) is being 100% opened. In Step 3, Gas B is supplied, and the upstream-side exhaust valve is being closed.

Figure 3:
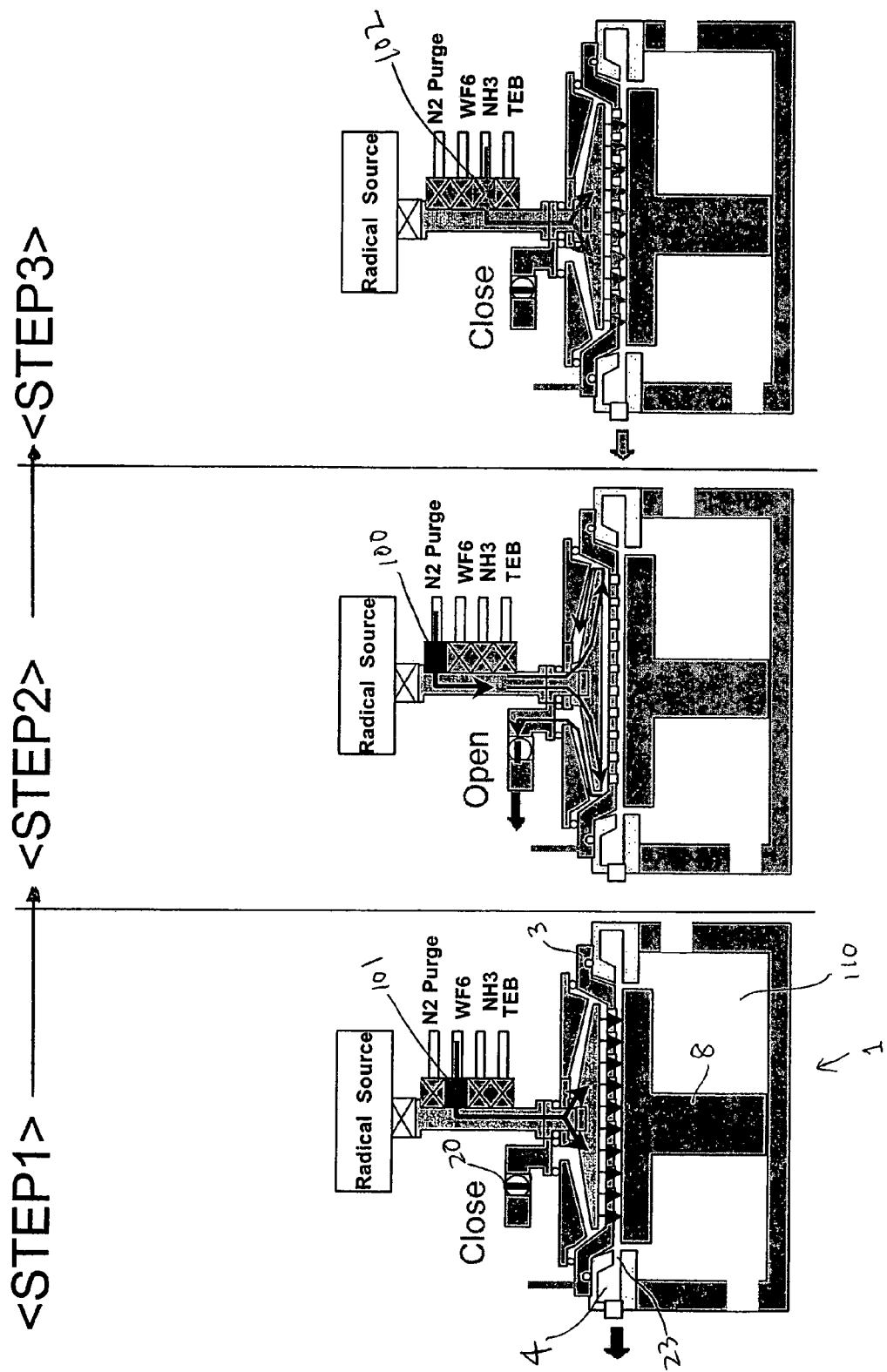

FIG. 3 is a schematic explanatory view showing one example of the film formation process; Steps 1, 2 & 3 are shown. These figures are excessively simplified for purposes of illustration. In Step 1, $WF_6$ gas is supplied, and an exhaust valve (upstream-side exhaust valve) before the gas-dispersion plate is being closed. In Step 2, purge is conducted using $N_2$ gas (1-5 SLM), and the upstream-side exhaust valve (maximum exhaust conductance 38 liter/sec or above) is being 100% opened. In Step 3, $NH_3$ gas is supplied, and the upstream-side exhaust valve is being closed.

Figure 4:
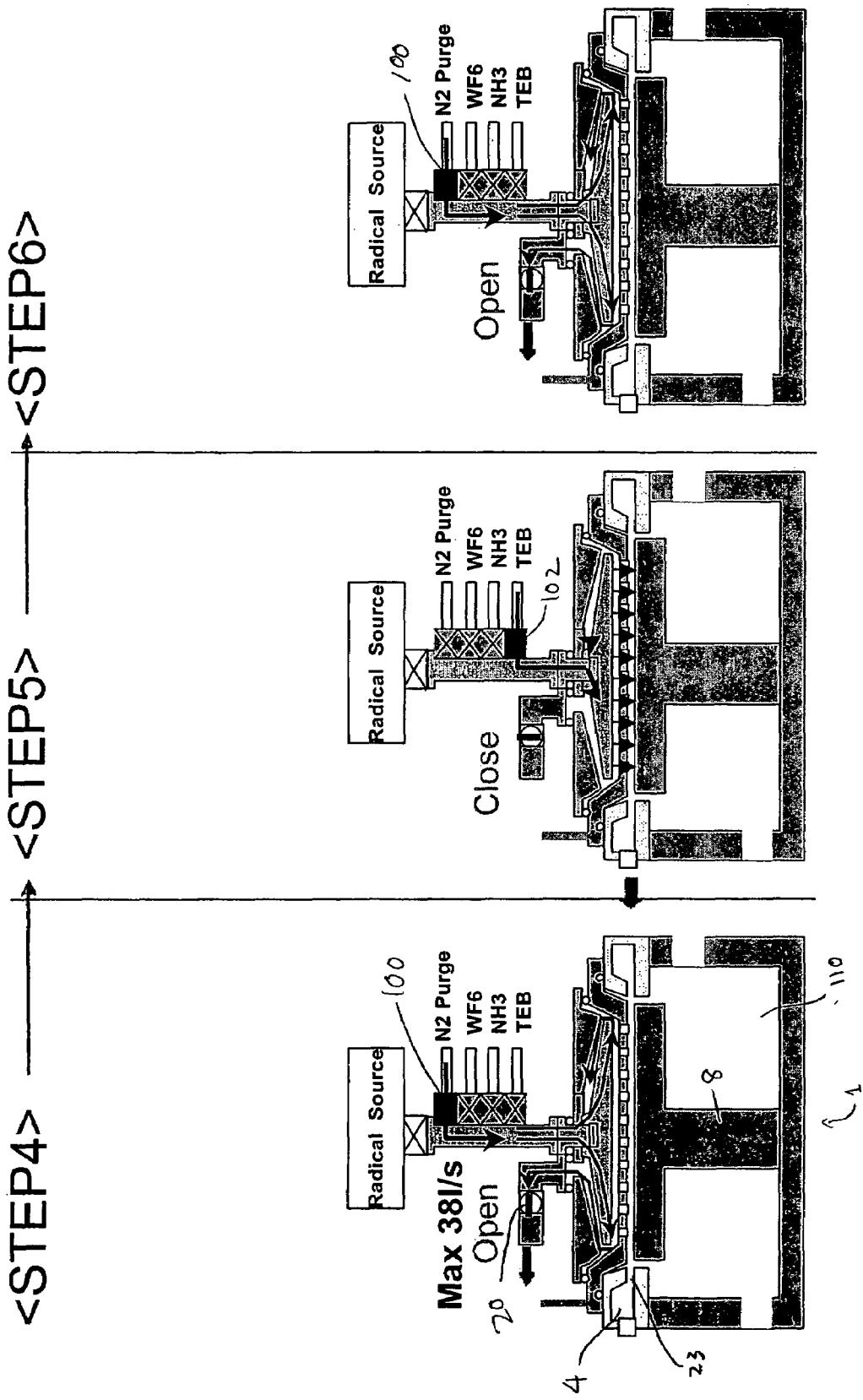

FIG. 4 is a schematic explanatory view showing one example of the film formation process shown in FIG. 3, in which sequential Steps 4, 5 & 6 are shown. These figures are excessively simplified for purposes of illustration. In Step 4, purge by $N_2$ gas (1-5 SLM) is conducted, and the upstream-side exhaust valve (maximum exhaust conductance 38 liter/sec or above) is being 100% opened. (An exhaust amount on the upstream side is larger than a gas passage amount in the dispersion plate.) In Step 5, a precursor, TEB is supplied, and the upstream-side exhaust valve is being closed. (An exhaust amount on the upstream side is smaller than a gas passage amount in the dispersion plate.) In Step 6, purge using $N_2$ gas is conducted, and the upstream-side exhaust valve is being opened. (An exhaust amount on the upstream side is larger than a gas passage amount in the dispersion plate.)

Figure 5:
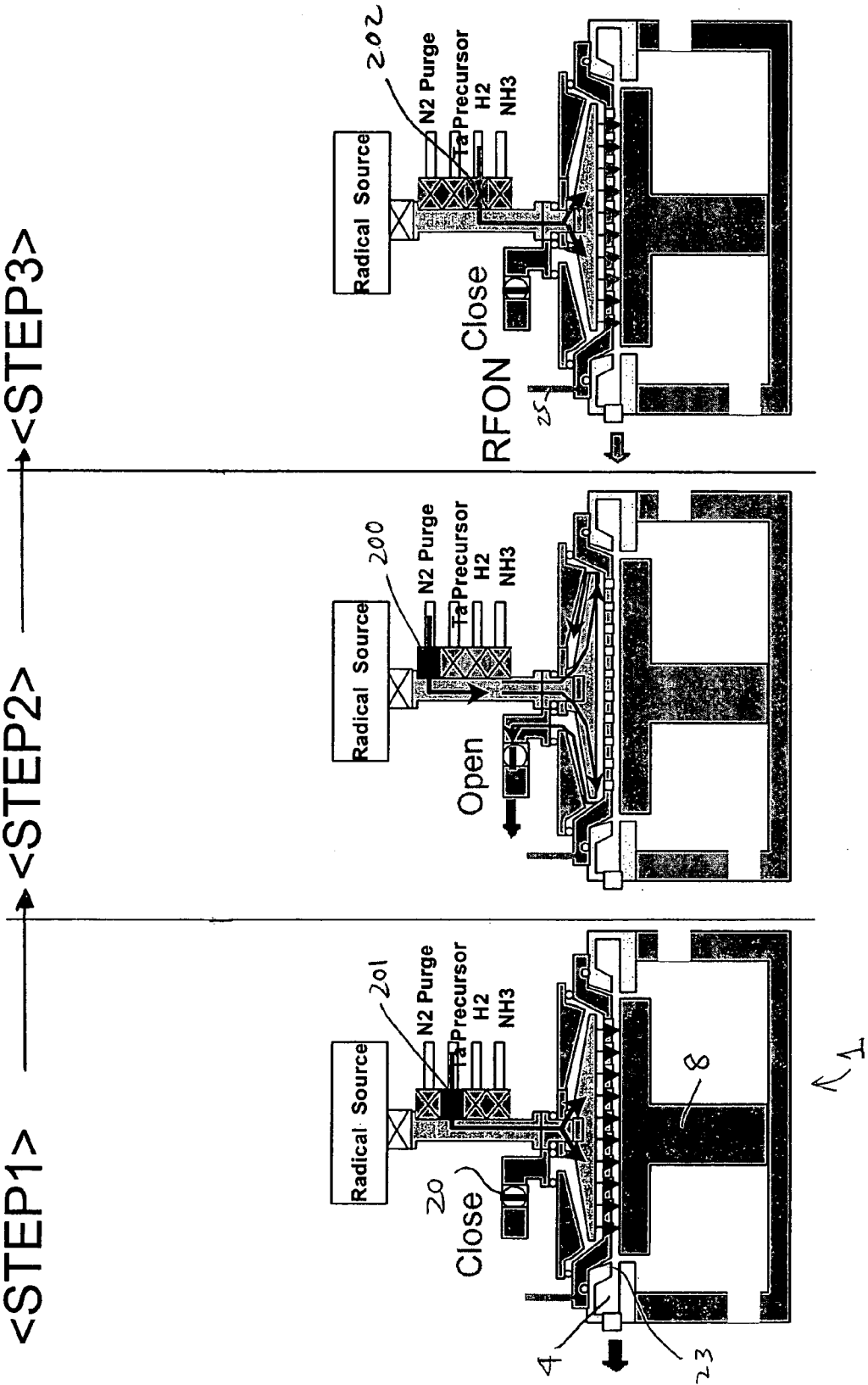

FIG. 5 is a schematic explanatory view showing another example of the film formation process according to the present invention, in which Steps 1, 2 & 3 are shown. These figures are excessively simplified for purposes of illustration. In Step 1, a precursor, TEB is supplied, and the upstream-side exhaust valve (the upstream-side exhaust valve) before the gas-dispersion plate is being opened. (An exhaust amount on the upstream side is smaller than a gas passage amount in the dispersion plate.) In Step 2, purge is conducted using $N_2$ gas (1-5 SLM), and the upstream-side exhaust valve (maximum exhaust conductance 38 liter/sec or above) is being 100% opened. (An exhaust amount on the upstream side is larger than a gas passage amount in the dispersion plate.) In Step 3, $H_2$ gas is supplied, the upstream-side exhaust valve is being closed, and $H_2$ plasma is generated. (An exhaust amount on the upstream side is smaller than a gas passage amount in the dispersion plate.)

Figure 6:
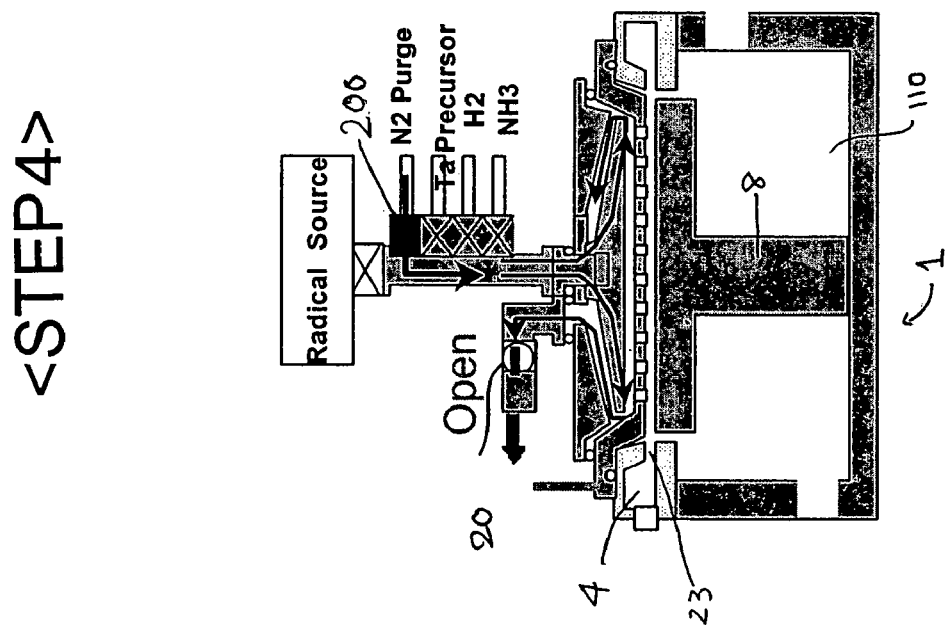

FIG. 6 is a schematic explanatory view showing another example of the film formation process shown in FIG. 5, in which sequential Steps 4, 5 & 6 are shown. These figures are excessively simplified for purposes of illustration. In Step 4, purge using $N_2$ gas (1-5 SLM) is conducted, and the upstream-side exhaust valve (maximum exhaust conductance: 38 liter/sec or above) is being opened. (An exhaust amount on the upstream side is larger than a gas passage amount in the dispersion plate.)

EXPLANATION OF SYMBOLS USED

1: Reaction chamber
2: Upper lid
3: Dispersion plate
4: Exhaust duct
5: Lower lid
6: Gate for transfer use
7: Exhaust port
8: Heater
9: Bellows
10: Gas-introduction piping
11: Gas-introduction pipe
12: Radical source
13: Gas-dispersion guide
14: Space between the gas-dispersion guide 13 and the dispersion plate 3
15: Substrate
16: Gate valve for introducing radical source
17: Exhaust slit
18: Space between the exhaust slit 17 and the exhaust flange 19
19: Exhaust flange
20: Exhaust valve
21: Gas discharge port of the dispersion plate 3
22: Space between the dispersion plate 3 and the substrate-heating stand 8
23: Exhaust slit
24: Exhaust pipe
25: Electrode for applying RF power
26: Cartridge heater
30: Valve for nitrogen
31: Valve for Gas A
32: Valve for Gas B
33: Valve for Gas C
41: Internal wall of the dispersion guide 13
42: Cartridge heater
43: Intermediate dispersion element
100: Gas valve for nitrogen purge
101: Gas valve for WF6
102: Gas valve for NH3
103: Gas valve for TEB
200: Gas valve for nitrogen purge
201: Gas valve for Ta precursor
202: Gas valve for NH3
203: Gas valve for hydrogen
501: Reaction chamber
502: Upper lid
503: Dispersion plate
504: Exhaust duct
505: Lower lid
506: Gate for transfer use
507: Exhaust port
508: Heater
508A: Susceptor installed on the substrate-heating stand
509: Bellows
510: Gas-introduction piping
511: Gas-introduction pipe
512: Radical source
513: Gas-dispersion guide
514: Space between the gas-dispersion guide 13 and the dispersion plate 3
515: Substrate
516: Gate valve for introducing radical source
517: Exhaust slit
518: Space between the exhaust slit 17 and the exhaust flange 19
519: Through-bore for exhaust flange connection
520: Exhaust valve
521: Gas discharge port of the dispersion plate 3
522: Space between the dispersion plate 3 and the substrate-heating stand
523: Exhaust slit 524: Exhaust pipe
525: Electrode for applying RF power
526: Cartridge heater
530: Valve for nitrogen
531: Valve for Gas A
531A: Purge valve for Gas A
532: Valve for Gas B
532A: Purge valve for Gas B
533: Valve for Gas C
533A: Purge valve for Gas C
541:
542: Cartridge heater
543: Intermediate dispersion element
550: Source-gas diffusion prevention ring
551: Insulator
552: Through-bore being communicated with multiple spaces 518 provided in the upper lid 502 and a space 553
553: Ring-shaped space provide in the upper lid 502
554: Space inside the lower chamber 505
555: Exhaust port being communicated with the exhaust duct 504
556: Exhaust position adjustment ring (Exhaust ring)
557: Source-gas diffusion prevention ring
558: Gas manifold
559: Slit formed between the source-gas diffusion prevention ring 550 and the substrate-heating stand 508 or its width
559': Slit formed between the source-gas diffusion prevention ring 557 and the substrate-heating stand 508 or its width
564: Matching box

DETAILED DESCRIPTION OF THE PREFERRED EMBODIMENT

In a preferred embodiment of the present invention, in order to eliminate disadvantages of the showerhead in atomic layer growth, an exhaust port and a valve connected to the exhaust port are provided in the showerhead itself so that an amount of reaction gas remaining inside the showerhead can be easily reduced by opening/closing this valve. Conventionally in atomic layer growth, there was a problem that maintaining long-term valve reliability was difficult because the extremely high number of opening/closing times of a gas-supply valve and a gas-exhaust valve because thin-film growth was achieved by each atomic layer deposition. For this reason, in one embodiment, a gas flow is controlled using a conductance valve, which is capable of controlling conductance, for example, by approx. 100%-1%, preferably by approx. 100%-0.5%, as a gas-exhaust valve without closing the valves completely. In the embodiment such as this, whereas at the time of thin-film formation, it is required that a gas is supplied onto a substrate from the gas-dispersion plate of the showerhead, rather not the gas passing through the exhaust-side valve, at the time of exhaust, it is required that the gas is exhausted mostly from the exhaust-side valve. Consequently, it is important to keep an appropriate balance among conductance (Shower EVAC; Cse) going toward the exhaust-side valve when the exhaust-side valve is opened, conductance (Process Shower EVAC; Cpse) going toward the exhaust-side valve when conductance of the exhaust-side valve becomes minimum, and conductance (Process; Cpde) of a flow path of a gas going toward the substrate-side via the dispersion plate of the showerhead and being exhausted to an exhaust system connected to the apparatus. Certainly, when long-term valve reliability can be ensured, a valve capable of controlling conductance by approx. 100%-0% can also be used. Additionally, simply using a valve for opening and closing a flow path is also included in the configurations of the present invention.

As one embodiment of the above-mentioned balance, at the time of thin-film formation,
Cpse:Cpde=1 or below:5-20 (preferably 0.5-1:10-20);
at the time of exhausting gas from within the showerhead,
Cse:Cpde=100:<20.

Consequently, the following relation is established as one embodiment:
Cpse:Cpde:Cse=1 or below: 5-20:100 (preferably 0.1-1:10-20:100).

In other words, it is effective to set an effect of the exhaust-side valve conductance on exhaust from within the showerhead dispersion plate to be in the above-mentioned ratio. In an alternative embodiment, in order to implement preferential exhaust between exhaust through the exhaust valve and exhaust through the dispersion plate, it is effective that a conductance difference is approximately five times or more (including 10 times, 15 times, 20 times, 100 times, 500 times, 1,000 times, and values between each value). Needless to say, as compared with Cpde, it is desirable that Cpse is as small as possible and that Cse is as large as possible, However, Cpse and Cse are conductances of the same exhaust valve, and it is appropriate that its maximum and minimum should be within the range of 1-0%; according to one embodiment, the minimum value is reduced to 0.5% or below or 0%.

In the present invention, conductance (F) is defined as follows:

$$F=Qf/(p2-p1)$$

Qf: Gas flow rate, Qf=p(dV/dt)
dV/dt: Volume flow rate
p: Pressure of a location, where a volume flow rate is measured.

The reciprocal of conductance, 1/F, is equivalent to impedance. In other words, if 1/F is large, it means high impedance and 'it is difficult for gas to flow'; if 1/F is small, it means 'it is easy for gas to flow'. In one embodiment of the present invention, an amount equivalent to impedance can be changed within the range of 1 to 100 or 1 to 1,000 instantaneously. For example, conductance can be 2 to 3 digits variable at high speed of approx. 50 msec (including 10 msec, 25 msec, 50 msec, 75 msec, 100 msec, 150 msec, and values between each value). In other words, if impedance at one point of time is 1 (conductance is 1), in the subsequent point of time, impedance is changed to approx. 100 to approx. 1,000 (the conductance is changed to approx. 1% to approx. 0.1%) and it becomes extremely difficult for gas to flow. By repeating such instantaneous impedance value change and by repeating an easy-to-flow state and a difficult-to-flow state in a short period of time, reaction gas remaining in an apparatus using the showerhead can be eliminated nearly completely, thereby enabling to form uniform films with high throughput, which was conventionally unthinkable. High-speed valve control is possible preferably if the minimum conductance is within the range of approx. 0.1% to approx. 1% as mentioned above (including 0.25%, 0.5%, 0.75%, and values between each value); in one embodiment, however, high-speed valve control is possible even if it is within the range of approx. 1% to approx. 10% (including 2%, 3%, 5%, and values between each value).

Such instantaneous conductance control can be realized by rotating a valve body in a vacuum by transmitting power generated by axial rotation, e.g., by using a servomotor. Because the servomotor is controlled at tens of thousands pulses per second, rotation start, high-speed rotation, rotation stop, etc. can be realized without problems by controlling axial rotation speeds. In addition to the servomotor, as long as a mechanism is capable of introducing rotation into a vacuum at high speed and of controlling opening/closing of the valve body in increments of approx. 0.1 sec or approx. 0.2 sec or in increments of approx. 1 sec or below depending on embodiments, any mechanism can be adopted. In a preferred embodiment of the present application, in conjunction with a process gas recipe, actuating the valve at high speed improves throughput and film uniformity. Additionally, even when only opening/closing of an exhaust valve is conducted, the same effect can be obtained if sufficient valve reliability is ensured.

Additionally, when the valve is controlled at high speed in conjunction with a process gas recipe, because a process gas is changed at high speed, there may be cases in which a previous reaction gas remains inside the showerhead when a subsequent process gas is introduced depending on a reactor structure or a showerhead structure. If occurrence of such remaining gases have a negative effect on film quality, it is effective to implement evacuation operation in addition to high-speed valve control. It takes more time, however, because introducing a process gas is put on standby if the evacuation operation is implemented. Preferably, a structure of a showerhead and others should be altered so that remaining gases are all swept away by a gas introduced. In other words, by employing a hydrodynamically streamlined structure by which all areas where gases easily can remain are eliminated, process steps can be consecutively executed only by implementing high-speed valve operation without occurrence of remaining gases.

In the high-speed valve operation, the steps of introducing a process gas (showerhead exhaust valve conductance is small or the valve is closed), purging the gas (showerhead exhaust valve conductance is large), introducing a subsequent process gas (showerhead exhaust valve conductance is small or the valve is closed), purging the gas (showerhead exhaust valve conductance is large) are repeated; one cycle is completed after all prescribed process gases are introduced.

When thin-film formation is executed only by implementing the high-speed valve operation, depending on a gas recipe as well, the length of one cycle takes approx. 0.2 sec to approx. 5 sec (including 0.3 sec, 0.4 sec, 0.5 sec, 0.6 sec, 0.7 sec, 0.8 sec, 0.9 sec, 1 sec, 2 sec, 3 sec, 4 sec, or values between each value; preferably approx. 0.5 sec to approx. 3 sec). Times required for gas introduction and gas purge are accordingly determined by conductance control, a targeted film type, a showerhead structure and others; in one embodiment, it is within the range of approx. 0.05 sec to approx. 1 sec (including 0.1 sec, 0.2 sec, 0.3 sec, 0.4 sec, 0.5 sec, 0.7 sec, and values between each value).

Additionally, a film thickness growth in one cycle is within the range of approx. 0.1 atomic layer to approx. 2 atomic layers in one embodiment; preferably approx. 0.2 atomic layer to approx. 1.1 atomic layers; basically one atomic layer per cycle; it is preferable that thin-film thickness grows for every atomic layer deposition. An actual film thickness growth differs depending on materials; in one embodiment, it was from approx. 0.8 Å to approx. 1.2 Å; according to an alternative embodiment, thin-film thickness growth can be within the range of approx. 0.5 Å to approx. 1.5 Å.

The number of cycles required for ultimate film formation is determined accordingly by a targeted film thickness. According to embodiments, film formation is completed by approx. 10 cycles to approx. 200 cycles (including 20, 30, 50, 100, 150, and values between each value).

Additionally, a pressure inside the reaction chamber is, in one embodiment, within the range of approx. 0.1 Torr to approx. 10 Torr (preferably from approx. 0.5 Torr to approx. 5 Torr) at the time of film formation; within the range of approx. 0.1 Torr to approx. 30 Torr (preferably from approx. 1 Torr to approx. 10 Torr) at the time of purge.

Targeted process gases particularly are not limited, but gases containing W, Ta, Mo, Nb, N, C, H, B, Si, F, etc. can be used. According to a targeted film, plasma is applied accordingly.

As a purge gas, He, Ar, Ne, etc. are used accordingly.

By referring to figures, one example of a configuration of the thin-film formation apparatus according to the present invention is described below. The present invention is not limited to the following configuration:

FIG. 1A-E shows a cross section of one embodiment of the thin-film formation apparatus according to the present invention. FIG. 2 shows one example of the process sequence according to one embodiment of the present invention.

Figure 1A:
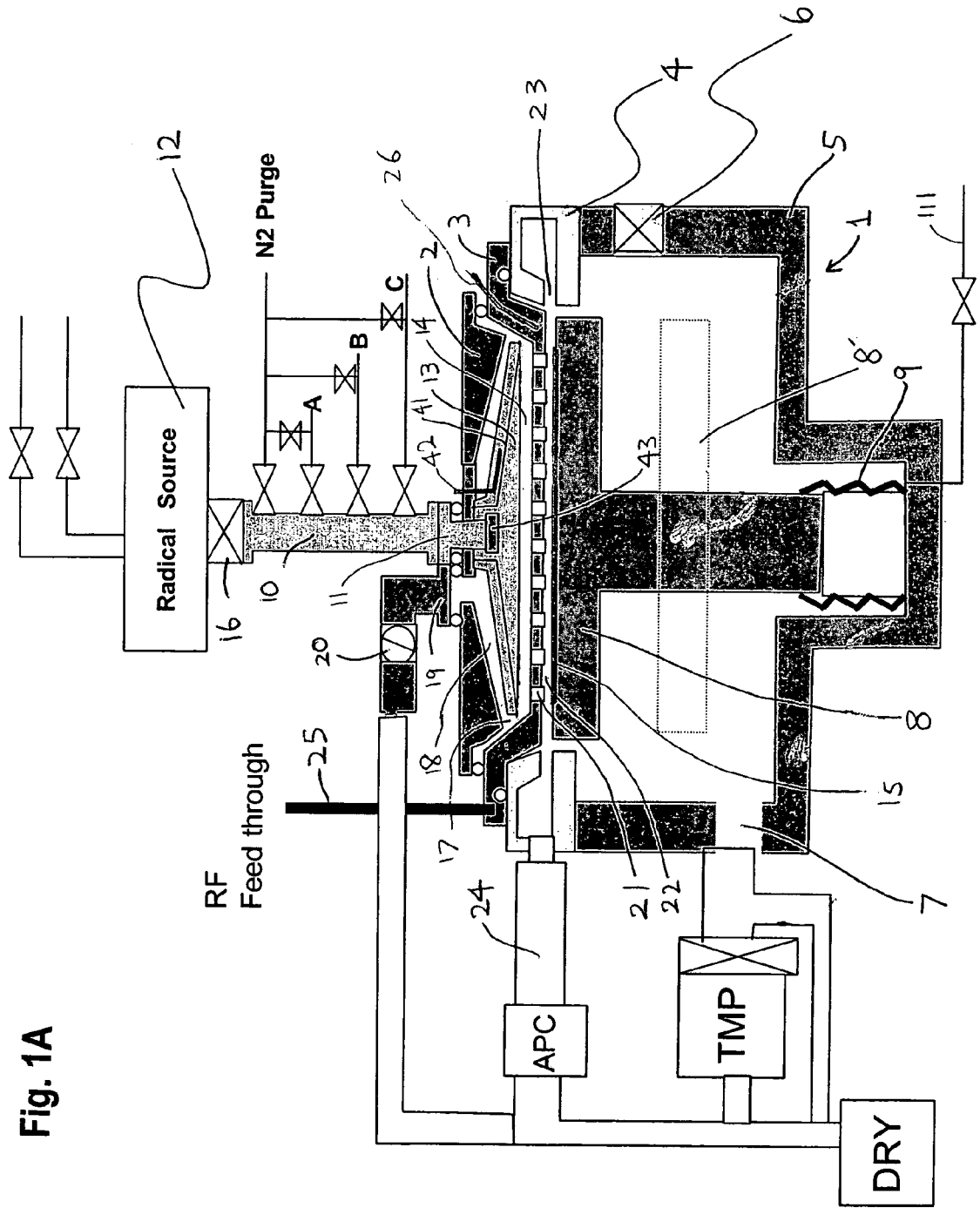
FIG. 1A is a schematic view showing one example of the apparatus according to the present invention; the figure is excessively simplified for facilitating understanding (a gas passage amount of the gas-dispersion plate is 2.3 litter/sec).

After a semiconductor substrate, which is a workpiece, is transferred from a vacuum transfer chamber (not shown) to a reaction chamber 1, the thin-film formation apparatus shown in FIG. 1A is able to execute a thin-film formation process in this reaction chamber 1. This reaction chamber comprises an upper lid 2, a dispersion plate 3, an exhaust duct 4, a lower chamber 5, a substrate-transfer gate 6, an exhaust port 7, a substrate-heating heater 8, and bellows 9 for moving the substrate-heating heater up and down.

After being introduced into the reaction chamber 1, the semiconductor substrate 15 is placed on the substrate-heating heater 8'; with this substrate-heating heater being moved upward, the semiconductor substrate 15 can be moved to a position in which a distance between the dispersion plate 3 and the substrate is optimal.

Additionally, the upper lid 2 is connected to piping 10 for introducing gases and a gas-introduction portion 11.

A reaction gas is connected to the piping 10, or nitrogen gas or an inert gas for reaction gas purge is connected to it. Additionally, a radical source 12 is connected to the piping 10 via a gate valve 16; by opening the gate valve 16, radicals generated from various gases in the radical source 12 can be introduced.

Figure 1B:
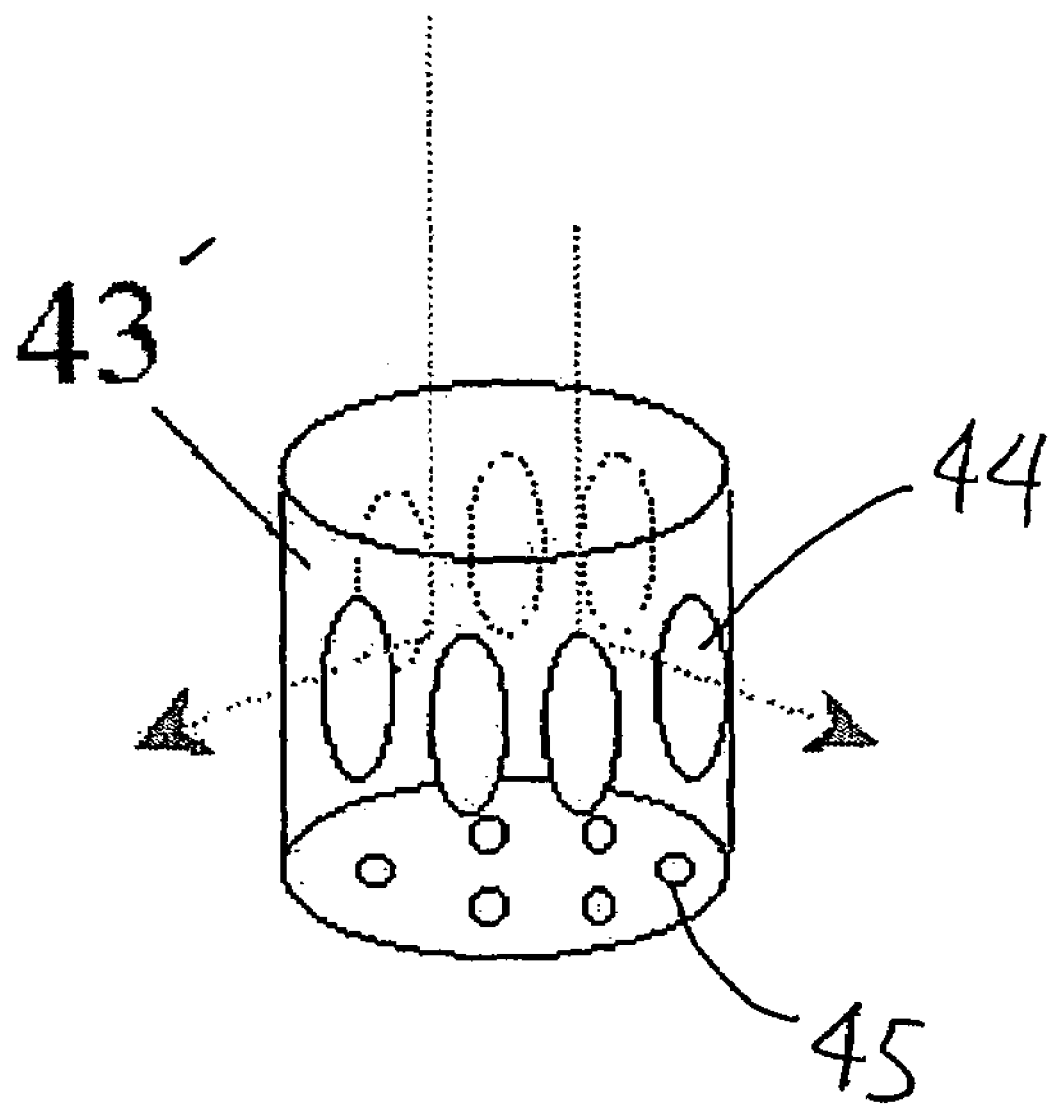
FIG. 1B is a schematic view showing one example of the intermediate dispersion element which can apply to the apparatus according to the present invention; the figure is excessively simplified for facilitating understanding.

The gas-introduction portion 11 is connected to the gas-dispersion guide 13; a gas introduced from the gas-introduction portion 11 is dispersed by being diffused inside the gas-dispersion guide 13. Additionally, the gas-introduction portion 11 can also possess a dispersion mechanism capable of introducing a gas by dispersing it inside the gas-dispersion guide 13. For example, an intermediate dispersion element 43' having a cylindrical cap shape as shown in FIG. 1B can be provided at the tip of the gas-introduction portion 11. Pores 44 (multiple pores or two or more slits) are provided on a lateral surface of the intermediate dispersion element 43' so that the gas is evenly discharged horizontally and in a circumferential direction; furthermore/or pores 45 (multiple pores or two or more slits) may be provided on the underside of the intermediate dispersion element in positions not overlapping with pore positions of the dispersion plate 3 so that the gas is discharged vertically. Additionally, although the intermediate dispersion element 43 shown in FIG. 1A is depicted more flatly than the intermediate dispersion element 43' shown in FIG. 1B, a height of the cap-shaped intermediate dispersion element 43 can be determined appropriately according to a gas flowing state.

Additionally, although the gas-dispersion guide 13 has a horn shape and openings on the lower side in the above-mentioned example, instead of providing the above-mentioned intermediate dispersion element 43, the openings on the lower side may be blocked off by an intermediate plate, and multiple slits or pores may be provided in the intermediate plate. This intermediate plate also functions as the second dispersion plate.

Additionally, in order to accommodate changes in exhaust conductance in a short period of time, an internal capacity of the gas-dispersion guide 13 is preferably smaller; as one example of the gas-dispersion guide 13 having a flat truncated cone shape, an angle of the circular conical surface is approx. 3 degrees to approx. 30 degrees (including 5 degrees, 10 degrees, 15 degrees, 20 degrees, 25 degrees, and values between each value; preferably approx. 5 degrees—approx. 15 degrees) to a level surface. If it is zero degree, dispersing a gas onto the gas-dispersion plate evenly becomes difficult. Additionally, a distance between the lower end of the gas-dispersion guide and the gas-dispersion plate is approx. 2 mm to approx. 10 mm (including 3 mm, 5 mm, 7 mm, and values between each value) according to one embodiment; a narrower distance within the range that gas can be dispersed moderately is preferable. Additionally, a shape of internal walls of the gas-dispersion guide 13 can be approximated streamline from a hydrodynamic point of view.

Additionally, a heater 42 is provided in an internal wall of the dispersion guide 13; gases introduced into the dispersion guide can be heated. Additionally, film formation can be adjusted by providing a heater 26 in the dispersion plate 3.

A slit exhaust port 17 is formed between the tip of the gas-dispersion guide 13 and the dispersion plate 3. This slit is provided, for example, in a circular shape at the tip of the dispersion guide 13. A shape of the exhaust port is not particularly limited and any shape is satisfactory as long as a shape and a position do not create spots in which a flow is hydrodynamically disrupted. For example, the exhaust port can comprise multiple circular-arc-shaped slits, multiple circular pores, etc. An aperture of the slit 17 (or pores) is approximately the same degree as a gap provided between the lower end of the gas-dispersion guide and the gas-dispersion plate in one embodiment, or from approx. 2 mm to approx. 5 mm.

The exhaust slit 17 is communicatively connected with a space 18; the space 18 is formed by an external wall of the dispersion guide 13 and the upper lid 2 and is communicatively connected with a space enclosing the gas-introduction portion 11. In the upper lid, a flange connection port 19 for exhaust use is formed by being communicatively connected with the space 18; and further exhaust piping and a conductance variable valve 20 are connected. An aperture of the space 18 is also approximately equal to the gap provided between the lower end of the gas-dispersion guide and the gas-dispersion plate in one embodiment.

Additionally, a pressure of the gas drops by going through the space 18 via the slit 17, and this may lower responsiveness to exhaust conductance changes in a short period of time. Consequently, in one embodiment, without providing the space 18, the slit 17 may be made to be annular, at which an annular duct is provided, and a connection port 19 is connected to the duct. In the embodiment using the annular duct has good responsiveness to exhaust conductance changes to some degree as compared with the embodiment using the space 18, because an area contacting the gas is small; however, because the connection port is provided in a disproportionate position in relation to the annular duct, it is inferior in exhausting gas uniformly. In the embodiment using the space 18, the connection port 19 can be provided in the vicinity of the center of the space 18, thereby enabling to exhaust gas uniformly.

After going through the gas-dispersion guide 13, reaching a space 14, further going through a gas-discharge port 21 provided in the dispersion plate 3, the gas reaches a space 22 between a substrate-heating stand 8 and the dispersion plate 3, and then reaches a surface of a substrate 15, further goes through a ring-shaped slit 23 formed in the exhaust duct 4, and is exhausted from an exhaust pipe 24 communicatively connected with the slit 23. A gas flow rate from the dispersion plate 3 to the space 22 is approx. 2-3 liter/sec. By feeding RF power to the dispersion plate 3 from an electrode 25, plasma can be generated between the dispersion plate 3 and the substrate-heating stand 8.

Figure 1C:
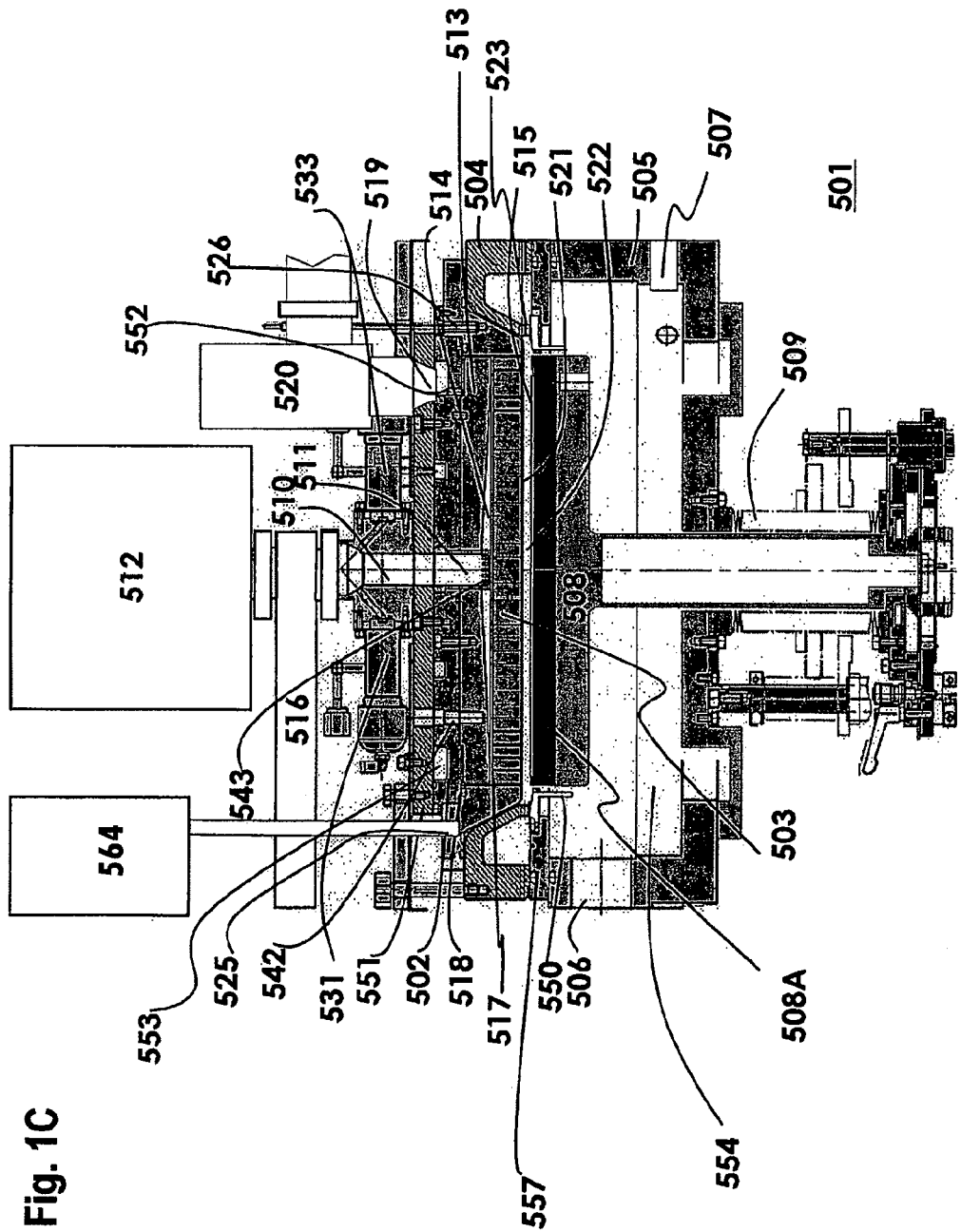
FIG. 1C is a schematic view showing one example of the apparatus according to the present invention.

FIG. 1C shows a cross section of the thin-film formation apparatus according to one embodiment of the present invention.

After a semiconductor substrate, which is a workpiece, is transferred from a vacuum transfer chamber (not shown) to a reaction chamber 501, this thin-film formation apparatus is able to execute a film formation process in this reaction chamber 501. This reaction chamber comprises an upper lid 502, a dispersion plate 503, an exhaust duct 504, a lower chamber 505, a substrate-transfer gate 506, an exhaust port 507, a substrate-heating heater 508, a wafer susceptor 508A installed on the substrate-heating stand, and bellows 509 for moving the substrate-heating heater up and down.

After being introduced into the reaction chamber 501, the semiconductor substrate 515 is placed on the wafer susceptor 508A installed on the substrate-heating stand; with this substrate-heating stand 508 moving upward, the semiconductor substrate 515 can be moved to a position in which a distance between the dispersion plate 503 and the substrate 515 is optimal.

Additionally, the upper lid 502 is connected to piping 510 for introducing gases and a gas-introduction portion 511.

A reaction gas is connected to the piping 510, or nitrogen gas or an inert gas for reaction gas purge is connected. Additionally, a radical source 512 is connected to the piping 510 via a gate valve 516; by opening the gate valve 516, radicals generated from various gases in the radical source 512 can be introduced.

The gas-introduction portion 511 is connected to the gas-dispersion guide 513; a gas introduced from the gas-introduction portion 511 is dispersed by being diffused inside the gas-dispersion guide 513. Additionally, the gas-introduction portion 511 can possess a dispersion mechanism capable of introducing a gas by dispersing it inside the gas-dispersion guide 513. For example, an intermediate dispersion element 43' having a cylindrical cap shape as shown in FIG. 1B can be provided at the tip of the gas-introduction portion 511. Pores 44 (multiple pores or two or more slits) are provided on a lateral surface of the intermediate dispersion element 43' so that the gas is evenly discharged horizontally and in a circumferential direction to the gas-dispersion plate 503; furthermore/or pores 45 (multiple pores or two or more slits) may be provided on the underside of the intermediate dispersion element in positions not overlapping with pore positions of the dispersion plate 503 so that the gas is discharged vertically. Additionally, although the intermediate dispersion element 543 shown in FIG. 1C is depicted more flatly than the intermediate dispersion element 43' shown in FIG. 1B, a height of the cap-shaped intermediate dispersion element 543 can be determined appropriately according to a gas flowing state.

Additionally, although the gas-dispersion guide 513 has a horn shape and openings on the lower side in the above-mentioned example, instead of providing the above-mentioned intermediate dispersion element 543, the openings on the lower side may be blocked off by an intermediate plate, and multiple slits or pores may be provided in the intermediate plate. This intermediate plate also functions as the second dispersion plate.

Additionally, in order to accommodate changes in exhaust conductance in a short period of time, an internal capacity of the gas-dispersion guide 513 is preferably smaller; as one example of the gas-dispersion guide 513 having a flat truncated cone shape, an angle of the circular conical surface is approx. 3 degrees to approx. 30 degrees (including 5 degrees, 10 degrees, 15 degrees, 20 degrees, 25 degrees, and values between each value; preferably approx. 5 degrees to approx. 15 degrees) to a level surface. If it is zero degree, dispersing a gas onto the gas-dispersion plate evenly becomes difficult. Additionally, a distance between the lower end of the gas-dispersion guide and the gas-dispersion plate is approx. 2 mm to approx. 10 mm (including 3 mm, 5 mm, 7 mm, and values between each value) according to one embodiment; a narrower distance within the range that gas can be dispersed moderately is preferable. Additionally, a shape of internal walls of the gas-dispersion guide 513 can be approximated streamline from a hydrodynamic point of view.

Additionally, a heater 542 is provided in an internal wall of the dispersion guide 513; gases introduced into the dispersion guide can be heated. Additionally, film formation can be adjusted by providing a heater 526 in the dispersion plate 503.

A slit exhaust port 517 is formed between the tip of the gas-dispersion guide 513 and the dispersion plate 503. This slit is provided, for example, in a circular shape at the tip of the dispersion guide 513. A shape of the exhaust port is not particularly limited and any shape is satisfactory as long as a shape and a position do not create spots in which a flow is hydrodynamically disrupted. For example, the exhaust port can comprise multiple circular-arc-shaped slits, multiple circular pores, etc. An aperture of the slit 517 (or pores) is approximately equal to a gap provided between the lower end of the gas-dispersion guide and the gas-dispersion plate in one embodiment, or from approx. 2 mm to approx. 5 mm.

The exhaust slit 517 is communicatively connected with a space 518; the space 518 is formed by an external wall of the dispersion guide 513 and the upper lid 502; this gas discharge path is formed on a ring; by multiple through-bores being formed in the upper lid 502, the space 518 is communicatively connected with the ring-shaped space 553 being formed in the top surface of the upper lid 502 up to multiple exhaust through-bores 519 for connecting a flange, which are formed by passing right through an insulator 551, and further exhaust piping and a conductance variable valve 520 are connected. An aperture of the space 518 is also approximately equal to the gap provided between the lower end of the gas-dispersion guide and the gas-dispersion plate in one embodiment.

The slits 517 and 518 here are annular ducts, and are connected to the ring-shaped space 553 being formed in the upper portion of the upper lid 502 via multiple through-bores 552; and the through-bores 519 for connection use are connected to this ring-shaped space 553. By going through the through-bores 552, uniform exhaust can be achieved by anomalous rectification even if a flange connection port for exhaust use is connected to the ring-shaped space at one spot.

After going through the gas-dispersion guide 513, reaching a space 514, further going through a gas-discharge port 521 provided in the dispersion plate 503, the gas reaches a space 522 between the wafer susceptor 508A installed on the substrate-heating stand 508 and the dispersion plate 503, and then reaches a surface of a substrate 515, further goes through a ring-shaped slit 523 formed in the exhaust duct 504, and is exhausted from an exhaust pipe (not shown) communicatively connected with the slit 523. At this time, if a source gas supplied from the dispersion plate 503 to the space 522 is diffused in a space 554 below the substrate-heating stand 508 on the side of the lower lid 505, the source gas remains and a gas phase reaction occurs when a subsequent source gas is introduced, and microscopic products tend to be generated. A source-gas diffusion prevention ring 550 has a ring shape enclosing the vicinity of the substrate-heating stand 508, or by reducing an interval between the substrate-heating stand 508 and the ring 550 to a minute distance, e.g., approx. 1 mm (in one embodiment, between approx. 0.3 min to approx. 2 mm, or between approx. 0.5 mm to approx. 1.5 mm, or between approx. 0.5 mm to approx. 1 mm, or within the range of a combination of the foregoing values), and by setting a length along the side of the heating stand 508 at approx. 20 mm to approx. 30 mm (in one embodiment, between approx. 5 mm to approx. 100 mm, or between approx. 10 mm to approx. 50 mm, or within the range of a combination of the foregoing values), source gas diffusion to the space 554 can be prevented by passing a purge gas from the space 554 to the space 522. A flow rate of the purge gas passing through the heating stand 508 and the ring 550 is approx. 100 sccm to approx. 3,000 sccm (including 200 sccm, 400 sccm, 600 sccm, 800 sccm, 1,000 sccm, 1,500 sccm, 2,000 sccm, and the range created by combining the foregoing values). RF power introduced from a match box 564 is introduced to the dispersion plate 503 from a RF electrode 525, and plasma can be generated between the dispersion plate 503 and the wafer susceptor 508A installed on the substrate-heating stand.

Figure 1D:
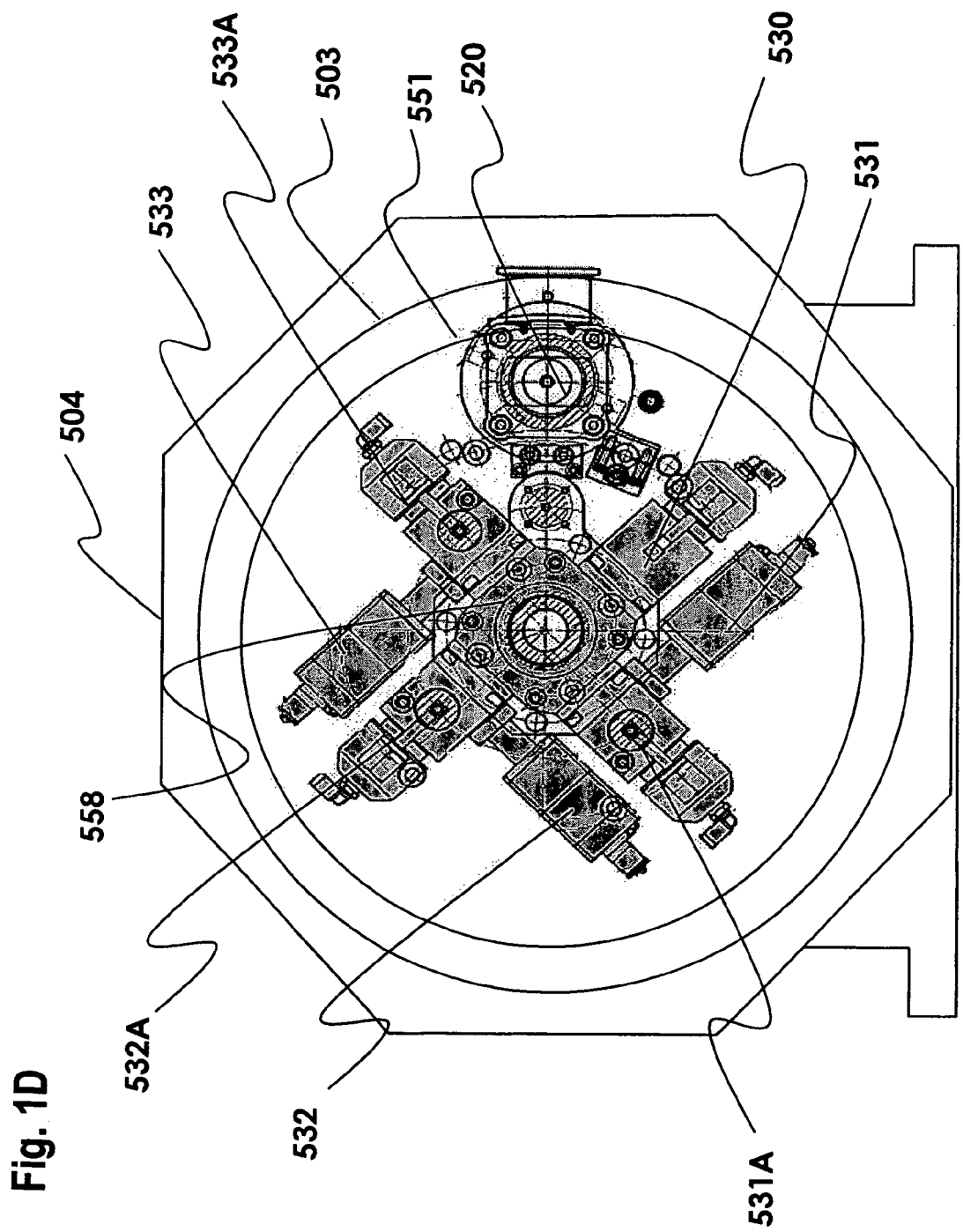
FIG. 1D is a schematic view showing the top surface of the apparatus shown in FIG. 1C.

FIG. 1D is a schematic view showing the top surface of the thin-film formation apparatus according to one embodiment shown in FIG. 1C. The gas-dispersion plate 503 is installed on the exhaust duct 504 installed on the lower chamber 505 (not shown in FIG. 1D); on the gas-dispersion plate 503, the gas-dispersion guide 513 (not shown) and the upper lid 502 (not shown) are installed; on the upper lid, the insulator 551 is installed; on the insulator, a gas manifold 558 ins which a gas valve is installed is installed. In FIG. 1D, 530 is a valve for purge gas; 531 is a valve for Gas A; 531A is a purge gas valve for Gas A; 532 is a valve for Gas B; 532A is a purge gas valve for Gas B; 533 is a valve for Gas C; 533A is a purge gas valve for Gas C. In this figure, the radical source 512, the gate valve for introducing radical source 516, and the matching box 564 shown in FIG. 1C are not shown. To the manifold 558, a center pipe 510 is attached, and the above-mentioned gas valves are attached to the manifold 558 around the center pipe. The exhaust valve 520 of the showerhead here is connected to the ring-shaped space 553 shown in FIG. 1C and is communicatively connected with the through bores for flange connection 519; the exhaust valve 520 is connected to it.

Figure 1E:
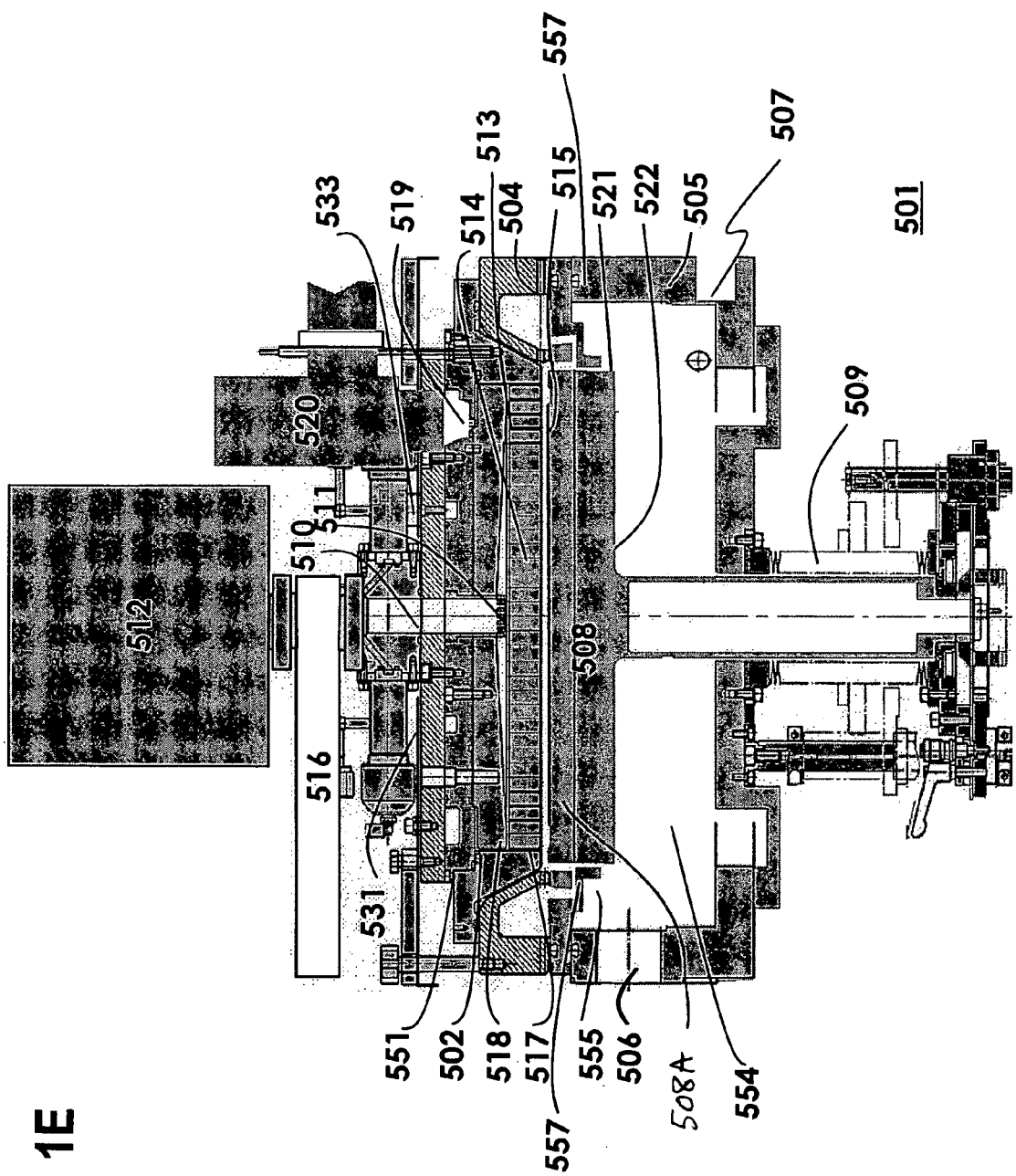
FIG. 1E is a schematic view showing a modified version of one example of the apparatus according to the present invention shown in FIG. 1C.

FIG. 1E is a schematic view showing another embodiment of the apparatus according to the present invention shown. In this cross section, instead of the source-gas diffusion prevention ring 550 shown in FIG. 1C, an exhaust-slit position adjustment ring (an exhaust ring) 556 and a diffusion prevention ring 557 are installed. A space between the exhaust ring 556 and the heating stand 508 is generally wider than an interval between the gas diffusion prevention ring 557 and the heating stand 508 (for example, approx. 1 mm or above, including 2 mm, 3 mm, 4 mm, 5 mm, and values between the foregoing; preferably approx. 2 to approx. 5 mm; further preferably approx. 2 to approx. 4 mm). By this setting, exhaust can be efficiently achieved. By this ring, it makes it possible to make a position 555 in which a source gas supplied from a discharge port of the gas-dispersion plate 521 flows into the exhaust duct 504 to be more distant from the top surface position on the substrate-heating stand than the one in the structure shown in FIG. 1C. Consequently, because it is possible to maintain a distance from an edge of a substrate 515 to an exit of the exhaust slit 559' longer than that in the structure shown in FIG. 1C, a drop in source gas concentration at the substrate edge can be suppressed. In other words, a purge gas is introduced into a reaction space 522 after passing through the slit 559'; at that time, a source gas from the reaction space 522 is also exhausted from an entrance 555 of the exhaust duct 504 along with the purge gas; if the distance from the exit of the slit 559' to the substrate edge is short, source gas concentration in the vicinity of the substrate edge may drop due to the purge gas. In an embodiment shown in FIGS. 1E and 1G, because the distance between the exit of the slit 559' and the substrate edge can be sufficiently secured, a drop in source gas concentration can be suppressed. Additionally, a diameter of the substrate-heating stand 508 can be adjusted at an optimal value. In other words, the distance from an edge of a substrate 515 to the exit of the slit 559' (also referred to as "the distance to the slit") can be secured within an adequate range without making a diameter of the substrate-heating stand 508 or the wafer susceptor 508A installed on the substrate-heating stand larger than a size of the substrate.

For example, it is preferable that a size of the substrate-heating stand 508 is approx. 120% or below (e.g., approx. 110% to approx. 120%) of a substrate diameter. (A size larger than this size is not preferable because it leads to enlarging of the apparatus. However, as mentioned above, we are caught in the middle, because the larger a diameter of the heating stand is as compared with a substrate diameter, the more a drop in source gas concentration in the vicinity of the substrate edge can be suppressed, i.e., a larger diameter is preferable.) By providing the entrance 555 of the exhaust duct 504 on the side of the heating stand, which is below the top surface of the heating stand, and by providing the exit of the slit 559' on the side of the heating stand and in the vicinity of the entrance of the exhaust duct 504, a distance to the exit of the slit 559' can be lengthened without enlarging a diameter of the heating stand. Because the exit of the slit 559' is provided at an outer circumferential edge of the top surface of the heating stand in FIGS. 1C and 1F, a distance from the exit of the slit 559 from a substrate edge becomes equal to a distance from a substrate edge to an outer circumferential edge of the heating stand. In FIGS. 1D and 1G, because the exit of the slit 559' is provided on the side of the heating stand, a distance from the substrate edge to the exit of the slit 559' can be lengthened without enlarging a diameter of the heating stand.

If the distance to the slit from the substrate edge is set, for example, at approx. 5% to approx. 15% of a substrate diameter, and if a distance from the substrate edge to the heating stand may be set at approx. 5% (i.e., a heating stand diameter is 110% of a substrate diameter), the distance from the heating stand edge to the slit may be set at a value within the range of approx. 0% to approx. 10% of a substrate diameter. Additionally, in one embodiment, by setting a distance from a substrate edge to the slit at approx. 3% to approx. 20% (including 5%, 7.5%, 10%, 12.5%, 15%, and values between the foregoing values) of a substrate diameter, and by setting a distance from a substrate edge to a heating stand edge at approx. 0% to approx. 10% (including 2.5%, 5%, 7.5%, and values between the foregoing values) of a substrate diameter, a distance from the heating stand edge to the slit can also be set at a value within the range of approx. 0% to approx. 10% (including 2.5%, 5%, 7.5%, and values between the foregoing values). For example, in the case of a substrate having 300 mm diameter, a distance from a substrate edge to the slit becomes approx. 15 mm to approx. 45 mm (5-15% of a substrate diameter); of these, if a distance from a substrate edge to the substrate-heating stand 508 or to an edge of the wafer susceptor 508A installed on the substrate-heating stand is 20 mm, the slit can be disposed with the exhaust port being disposed within the range of 0-25 mm from the substrate-heating stand 508 or the top surface of the wafer susceptor 508A installed on the substrate-heating stand. Optimal values for these dispositions can be determined in consideration of an optimal distance between the dispersion plate 502 and a substrate 515.

Figure 1F:
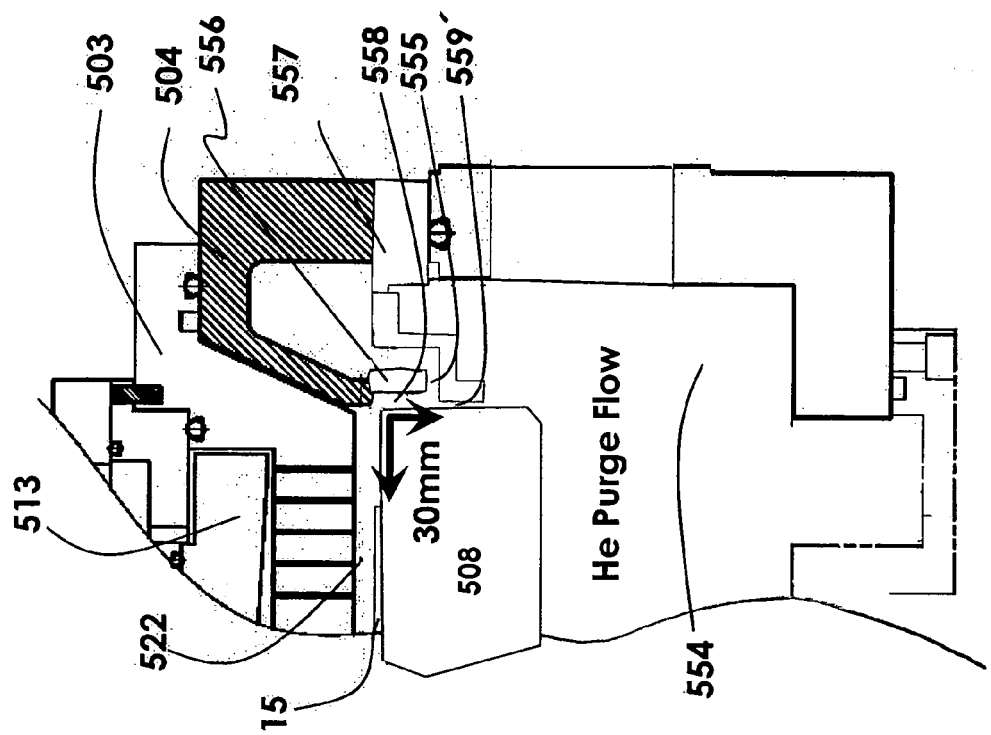
FIG. 1F is an enlarged schematic cross section showing the structure applied to Embodiments 1 and 2 using the structure shown in FIG. 1C. (Structure of lift pins, carrying in/out gate, etc. is omitted.)
Figure 1G:
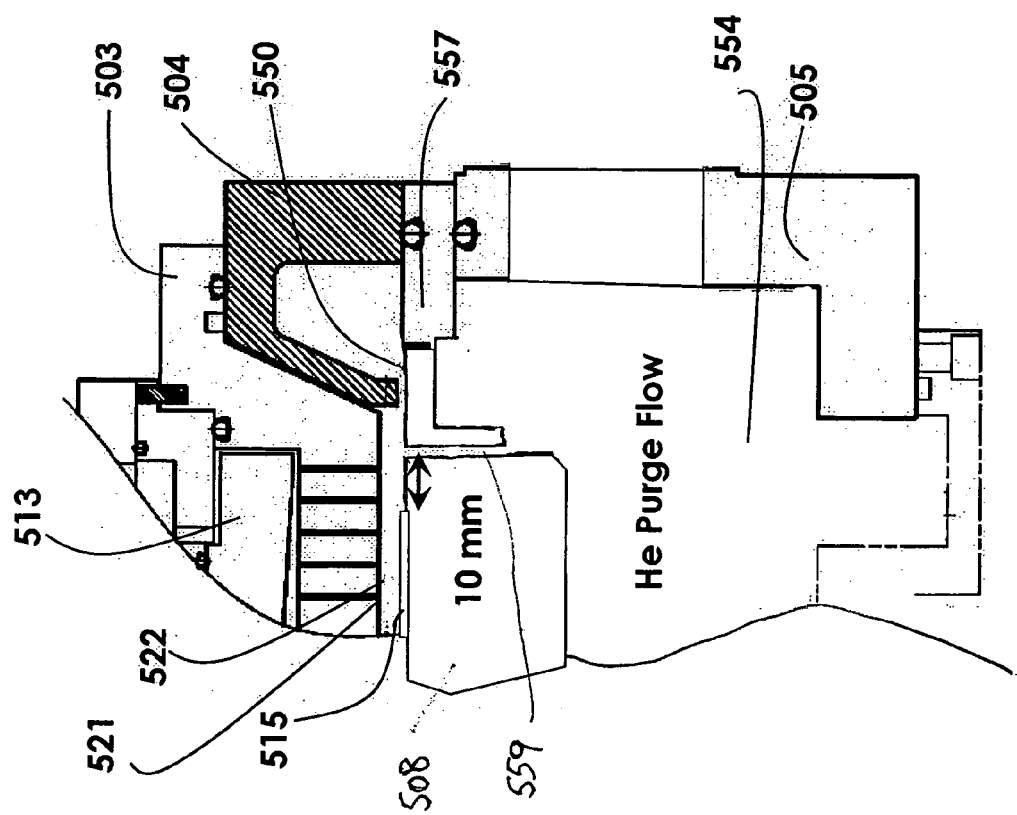
FIG. 1G is an enlarged schematic cross section showing the structure applied to Embodiments 1 and 2 using the structure shown in FIG. 1F. (Structure of lift pins, carrying in/out gate, etc. is omitted.)

Additionally, a length of the slit 559' (a length in the heating stand's axial direction of an gap formed by the ring 557 and the side of heating stand 508) can be approximately equal to a length of the slit 559 shown in FIG. 1F.

FIG. 2 shows a typical sequence of introducing a gas into the reaction chamber.

In Step 1 shown in FIG. 2, the valve 20 is being closed or conductance is controlled at 1% or below of full-opening valve conductance; by opening a valve 31, Gas A is introduced to a gas-supply pipe 10. In this case, Gas A is introduced from the gas-introduction portion 11 into the gas-dispersion guide 13, goes through the dispersion plate 3, is supplied onto a substrate surface, and is exhausted from the exhaust slit 23 to the exhaust pipe 24. At this time, because an exhaust amount of Gas A going through the dispersion plate 3 is overwhelmingly larger than an exhaust amount from the valve 20 side, Gas A can be sufficiently supplied onto the substrate surface.

After Gas A is supplied for a given period of time, in Step 2, the valve 31 for Gas A is closed, and then nitrogen gas is introduced from a valve 30 to the gas-supply piping 10. At this time, the valve 20 is fully opened. Remaining Gas A is purged by the nitrogen gas; at this time, an exhaust amount of the remaining gas from the valve 20 via the exhaust slit 17 is overwhelmingly larger than an amount exhausted from the exhaust slit 23 after going through the dispersion plate 3. Consequently, remaining Gas A is exhausted easily.

In Step 3, after the valve 30 is closed, and supply of nitrogen gas is shut off; the valve 20 is closed or conductance is changed to 1% or less of full-valve-opening conductance; Gas B is introduced by opening a valve 32 into the gas-supply piping 10. In this case, Gas B is introduced from the gas-introduction portion 11 into the gas-dispersion guide 13, goes through the dispersion plate 3, is supplied onto the substrate surface, and is exhausted from the exhaust slit 23 to the exhaust pipe 24. At this time, because an exhaust amount of Gas B going through the dispersion plate 3 is overwhelmingly larger than an exhaust amount from the valve 20 side, Gas B can be sufficiently supplied onto the substrate surface.

After Gas B is supplied for a given period of time with the valve 32 being closed, supply of Gas B is shut off; and in the state as shown in Step 2, remaining Gas B is exhausted from the valve 20. By repeating supply of Reaction Gas A and supply of Reaction Gas B by repeating these four steps, film formation by each atomic layer deposition can be realized.

Additionally, even if three kinds or more of reaction gases are used, film formation can be easily achieved by the same method by repeating steps of supplying three kinds or more of reaction gases and steps of purging the respective gases.

In these methods, because it is possible to easily purge an area inside the gas-dispersion plate 3 by changing conductance of the valve 20 at high speed, extremely high throughput can be achieved. Additionally, because conductance of the valve 20 is variable within the range of 2-3 digits, complete shut-off is not required, and hence extremely high valve reliability can be ensured. In other words, a problem in atomic-layer growth apparatuses, which is caused by declined valve reliability due to repeated opening/closing operations, can be prevented.

Additionally, at least when one kind of reaction gas of multiple reaction gases is supplied, by applying RF power to the dispersion plate 3, the reaction gas can also be supplied as a plasma gas. Additionally, because it is possible to raise a temperature of the inside of the dispersion guide 13 by introducing the heating stand 42 into the gas-dispersion guide 13, even when organic metal materials, which have low vapor pressure and easily cohere, are used, it becomes possible to exhaust them without cohesion at the time of both supply and exhaust.

In order to implement preferential exhaust in the above-mentioned operation, in one embodiment, the following relation is formed among conductance (Shower EVAC; Cse) going toward the exhaust-side valve when the exhaust-side valve is opened, conductance (Process Shower EVAC; Cpse) going toward the exhaust-side valve when conductance of the exhaust-side valve is set to be minimum, and conductance (Process; Cpde) at which gas goes toward the substrate-side via the dispersion plate of the showerhead and is exhausted to an exhaust system connected to the apparatus:

Cpse:Cpde:Cse=1 or below:5-20:100 (preferably, 0.1-1: 10-20:100)

Specific embodiments are shown below. The present invention is not limited to the following embodiments:

Embodiment 1

In this embodiment, a process of forming tungsten carbide nitride (WCN) films using tungsten hexafluoride ($WF_6$), ammonia ($NH_3$) and tetraethoxyboron (TEB) is described. After a silicon substrate is transferred from a vacuum transfer chamber (not shown in the figure) to the reaction chamber 1, remaining moisture, oxygen, etc. are exhausted thoroughly using a turbo pump (See FIG. 1A). The substrate is moved to a given position by a vertical-movement mechanism of the substrate-heating stand 8. At this time, a gap between the dispersion plate 3 and a substrate surface is set at a value within the range of 2-8 mm (1-10 mm according to one embodiment; 3, 4, 5, 6, 7, 8, 9 mm, and values between each value can be taken). In this embodiment, the process was implemented by setting the gap at 5 mm.

FIG. 3 and FIG. 4 show a process sequence: A silicon substrate is transferred from a vacuum transfer chamber (not shown) to the reaction chamber 1. The reaction chamber is exhausted by the turbo pump to $10^{-6}$ Torr or below. After an amount of remaining gases including moisture and oxygen is decreased, the substrate-heating stand 8 is moved upward so that a distance between the dispersion plate 3 and a surface of the silicon substrate placed on the substrate-heating stand 8 becomes 5 mm. Exhausting gases from a transfer-space portion by the turbo pump is switched to exhaust by a dry pump (not shown). Additionally, gases inside the reaction chamber are exhausted from an exhaust duct 4 via an exhaust slit 23. At this time, by narrowing a distance between the substrate-heating stand 8 and the exhaust duct 4, reaction gas is exhausted mostly from the exhaust duct 4. The substrate-heating stand 8 and the exhaust duct 4 can also be sealed. In this embodiment, however, by narrowing the gap between the substrate-heating stand 8 and the exhaust duct 4 and by controlling a pressure in a transfer space 110 by controlling an amount of nitrogen gas introduced into the space (for example, using the piping 111 shown in FIG. 1A), an amount of the reaction gas entering into the transfer-chamber side can be suppressed. The substrate-heating stand 8 is kept at a temperature of 320° C.

Step 1 shows a state in which conductance of the valve 20 is decreased to 1% of the maximum conductance; $WF_6$ gas is first supplied from a valve 101 for 0.2 sec.

In Step 2, after the valve 101 is closed and conductance of the valve 20 is increased to the maximum (approx. 38 liter/sec), a valve 100 is opened and 2,000 sccm of nitrogen gas is supplied; supply time is 0.1 sec.

In Step 3, the valve 100 is closed and in a state in which conductance of the valve 20 is decreased to 1% of the maximum conductance, $NH_3$ gas is first supplied from a valve 102 for 0.5 sec.

In Step 4, after conductance of the valve 20 is increased to the maximum conductance, the valve 100 is opened and 2,000 sccm of nitrogen gas is supplied; supply time is 0.3 sec.

In Step 5, in a state in which conductance of the valve 20 is decreased to 1% of the maximum conductance, TEB gas is first supplied from the valve 102 for 0.1 sec.

In Step 6, after conductance of the valve 20 is increased to the maximum conductance in the same manner as in Step 4, the valve 100 is opened and 2,000 sccm of nitrogen gas is supplied; supply time is 0.1 sec.

A pressure inside the reaction chamber was approx. 1 Torr at the time of film formation and approx. 5 Torr at the time of purge.

Time required for these six steps is 1.3 sec. This is the required time for one cycle. When one cycle was repeated 50 times, a film thickness of 40 Å was achieved. A film thickness of a WCM film formed by one cycle was 0.8 Å. Additionally, time required for 50 times of one cycle was 65 sec. By using the apparatus with the configuration according to the above-mentioned embodiment, it was seen that extremely high throughput was able to be achieved.

Additionally, in the method according to the above-mentioned embodiment of the present invention, while achieving extremely high throughput, the film-thickness uniformity was 1.8% at 1 sigma (5 mm edge removed), and the particle level was able to remain as low as 10 or less of particles with 0.16 μm or above (Ø300 mm silicon wafers). This means that even with a short cycle time, remaining reaction gas in each step can be eliminated nearly completely. This was achieved because by minimizing an internal capacity of the dispersion plate 3 and by minimizing a capacity of a space between the dispersion plate 3 and the exhaust duct 4 as much as possible as well as by eliminating areas in which gas flow easily stays, remaining reaction gases were able to be completely eliminated by nitrogen gas purge for a short period of time.

With the above, using the thin-film formation apparatus according to the above-mentioned embodiment of the present invention, it was seen that WCN films were able to be formed extremely efficiently.

Implementation of the present invention can be achieved in the same way as well in the apparatus having a configuration shown in FIGS. 1C-1E. After a silicon substrate is transferred from a vacuum transfer chamber (not shown) to the reaction chamber 501, remaining moisture, oxygen, etc. are exhausted thoroughly using a turbo pump (not shown). The substrate is moved to a given position by a vertical-movement mechanism of the substrate-heating stand 8. At this time, a gap between the dispersion plate 503 and a substrate surface 505 is set at a value within the range of 2-8 mm (1-10 mm according to one embodiment; 3, 4, 5, 6, 7, 8, 9 mm, and values between each value can be taken). In this embodiment, the process was implemented by setting the gap at 6 mm.

FIG. 3 and FIG. 4 show a process sequence: A silicon substrate is transferred from a vacuum transfer chamber (not shown) to the reaction chamber 501. The reaction chamber is exhausted by the turbo pump to $10^{-6}$ Torr or below. After an amount of remaining gases including moisture and oxygen is decreased, the substrate-heating stand 508 is moved upward so that a distance between the dispersion plate 503 and the silicon substrate placed on the substrate-heating stand 508 becomes 6 mm. Exhausting gases from a transfer-space portion by the turbo pump is switched to exhaust by a dry pump (not shown). Additionally, gases inside the reaction chamber (FIG. 1C) are exhausted from an exhaust duct 504 via an exhaust slit 523. At this time, by narrowing a distance between the substrate-heating stand 508 and the exhaust duct 504 by the source-gas diffusion prevention ring 550, reaction gas is exhausted mostly from the exhaust duct 504. Although it is possible to separate the space 554 from the space 522 by vacuum-sealing a gap between the substrate-heating stand 508 and an exhaust duct support ring 557, a structure becomes complex because it normally requires to avoid film formation on a sealed portion. In this embodiment, by narrowing the gap between the substrate-heating stand 508 and the source-gas diffusion prevention ring 550 and by controlling a pressure in a transfer space 554 by controlling an amount of nitrogen gas introduced into the space, entering of the reaction gas into the transfer-chamber side is avoided. The substrate-heating stand 508 is controlled to be kept at a temperature of 290-340° C. FIG. 1F shows a relation among the substrate-heating stand 508, the source-gas diffusion prevention ring 550 and the substrate 515. In one embodiment, the source-gas diffusion prevention ring 550 is manufactured from $Al_2O_3$ ceramic; a width between the side of the substrate-heating stand 508 and the source-gas diffusion prevention ring 550 is set at approx. 1 mm, and a distance from an edge of the substrate 515 to an edge of the substrate-heating stand 508 is set at 10 mm. Additionally, 1,200 sccm of helium is supplied from downward of the substrate-heating stand as a purge gas; this helium gas is exhausted from the slit 523 after going through the source-gas diffusion prevention ring 550 and the substrate-heating stand 508. Here the width is maintained at 1 mm by the source-gas diffusion prevention ring 550 and the substrate-heating stand 508, and the distance is 34 mm. In other words, a length of a portion along the substrate-heating stand 508 of the source-gas diffusion prevention ring 550 is set at 34 mm. By being communicated with this space of 1 mm in width and 34 mm in length, diffusion of a source gas supplied from the discharge port 521 into the space 554 can be prevented.

One example of allocation of source gas valves 531, 532 and 533 shown in FIG. 1D to $WF_6$, TEB, $NH_3$ source gases respectively is shown below, but the present invention is not limited to this example.

In FIG. 3, in Step 1 with the valve 520 being closed, $WF_6$ gas is first supplied from the valve 531 for 0.2 sec; in Step 2, after the valve 531 is closed and the valve 520 is opened (approx. 38 liter/sec), the valve 530 is opened and 2,000 sccm of nitrogen gas is supplied; supply time is 0.1 sec.

In Step 3, in a state in which the valve 530 is closed and the valve 520 is closed, $NH_3$ gas is first supplied from the valve 533; supply time is 0.5 sec.

In FIG. 4, in Step 4, after the valve 520 is opened, the valve 530 is opened and 2,000 sccm of nitrogen gas is supplied; supply time is 0.3 sec.

In Step 5, with the valve 520 being closed, TEB gas is first supplied from the valve 532 for 0.1 sec.

In Step 6, after conductance of the valve 20 is increased to the maximum conductance in the same manner as in Step 4, the valve 530 is opened and 2,000 sccm of nitrogen gas is supplied; supply time is 0.1 sec.

A pressure inside the reaction chamber was approx. 1 Torr at the time of film formation and approx. 5 Torr at the time of purge.

Time required for these six steps is 1.3 sec. This is the required time for one cycle. When one cycle was repeated 50 times, a film thickness of 40 Å was achieved. A film thickness of a WCM film formed by one cycle was 0.8 Å. Additionally, time required for 50 times of one cycle was 65 sec. By using the apparatus with the configuration according to the above-mentioned embodiment, it was seen that extremely high throughput was able to be achieved.

while achieving extremely high throughput, the film-thickness uniformity was 1.5% at 1 sigma (3 mm edge removed), and the particle level was able to remain as low as 15 pieces or less of particles with 0.16μm or above (Ø300 mm silicon wafers).

Additionally, in the method according to the above-mentioned embodiment shown in FIGS. 1C and 1E, while achieving extremely high throughput, the film-thickness uniformity was 1.5% at 1 sigma (3 mm edge removed), and the particle level was able to remain as low as 10 pieces or less of particles with 0.16 μm or above (Ø300 mm silicon wafers). This means that even with a short cycle time, remaining reaction gas in each step can be eliminated nearly completely. This shows that particle generation in the lower reactor space 554 was prevented by the source-gas diffusion prevention ring 550.

Similarly, an embodiment using the structure shown in FIGS. 1E and 1G is described below. Instead of the source-gas diffusion prevention ring 550, source-gas diffusion prevention and exhaust-slit position adjustment rings 556 and 557 (the exhaust ring 556 and gas diffusion prevention ring 557) are used.

Additionally, for the substrate-heating stand 508, a structure having a 20 mm larger diameter than the one shown in FIGS. 1C, and 1F is adopted. As shown in FIG. 1G, in this case, a distance between an edge of the substrate 515 and an edge of the substrate-heating stand is set at 20 mm. Additionally, the position 555 of the exhaust slit (the position in the heating stand side is the same as the position of the exit of the slit 559') is disposed approx. 10 mm below a surface of the substrate-heating stand 508. Additionally, a width 558 between a portion of the ring 556 and the substrate-heating stand 508, which is a portion above the exhaust slit position 555, is set at 3 mm. Additionally, a width 559' between a portion of the ring 557 and the substrate-heating stand 508, which is a portion below the exhaust slit position 555, is set at 1 mm and a length is set at 20 mm.

By this, and with setting a distance from an edge of the substrate 515 to the exhaust port 555 at approx. 30 mm and with an effect that inert-gas purge from the space 554 is discharged from the exhaust port 555 without being discharged to a surface of the substrate-heating stand 508, a drop in surface concentration of a source gas at an edge of the substrate 515 was suppressed, and for both sheet resistance uniformity and film-thickness uniformity of WNC films, 0.9% at 1 sigma (300 mm; 3 mm edge removed; 49-point measurement) was able to be achieved.

With the above, using the thin-film formation apparatus according to the above-mentioned embodiment of the present invention, by forming an exhaust valve capable of being opened/closed at high speed in a shower portion, it was shown that WCN films were able to be formed extremely efficiently, and that excellent uniformity was able to be achieved while reducing particles by optimizing gas purge from the lower portion of the substrate-heating stand, an exhaust position, and a distance from a substrate edge to the exhaust port.

Embodiment 2

In this embodiment, a process of forming tantalum nitride films using tertiaryamylimidotris(dimethylamido)tantalum: $TaN(C_4H_9)(NC2H_6)_3$, an organic metal material of Ta, and NH3. After a silicon substrate is transferred from a vacuum transfer chamber (not shown in the figure) to the reaction chamber 1, remaining moisture, oxygen, etc. are evacuated satisfactorily using a turbo pump 7 (See FIG. 1A). The substrate is moved to a given position by a vertical movement mechanism of the substrate-heating stand 8. At this time, a gap between the dispersion plate 3 and a substrate surface is set at a value within the range of 2-8 mm. In this embodiment, the process was implemented by setting the gap at 5 mm.

FIG. 5 and FIG. 6 show a process sequence: A silicon substrate is transferred from a vacuum transfer chamber (not shown) to the reaction chamber 1. The reaction chamber is exhausted by the turbo pump to $10^{-6}$ Torr or below. After an amount of remaining gases including moisture and oxygen is decreased, the substrate-heating stand 8 is moved upward so that a distance between the dispersion plate 3 and a surface of the silicon substrate placed on the substrate-heating stand 8 becomes 5 mm. Exhausting gases from a transfer-space portion by the turbo pump is switched to by a dry pump (not shown). Additionally, gases inside the reaction chamber are exhausted from an exhaust duct 4 via an exhaust slit 23. At this time, by narrowing a distance between the substrate-heating stand 8 and the exhaust duct 4, reaction gas is exhausted mostly from the exhaust duct 4. The substrate-heating stand 4 and the exhaust duct 4 can also be sealed. In this embodiment, however, by narrowing the gap between the substrate-heating stand 8 and the exhaust duct 4 and by controlling a pressure in a transfer space by controlling an amount of nitrogen gas introduced into the space (See the piping 111 shown in FIG. 1A.), an amount of the reaction gas entering into the transfer-chamber side can be suppressed. The substrate-heating stand 8 is kept at a temperature of 400° C.

Step 1 in FIG. 5 shows a state in which conductance of the valve 20 is decreased to 1% of the maximum conductance; Ta gas is first supplied from a valve 201 for 0.2 sec.

In Step 2, after the valve 201 is closed and conductance of the valve 20 is increased to the maximum, a valve 200 is opened and 2,000 sccm of nitrogen gas is supplied; supply time is 0.1 sec.

In Step 3, the valve 200 is closed, and in a state in which conductance of the valve 20 is decreased to 1% of the maximum conductance, $NH_3$ gas is first supplied from a valve 202. At this time, by introducing RF power of 13.56 MHz to the dispersion plate 3 via a RF electrode 25, $NH_3$ gas is excited into plasma; supply time of NH3 is 0.5 sec.

In Step 4, after introducing RF power is stopped and conductance of the valve 20 is increased to the maximum conductance, the valve 200 is opened and 2,000 sccm of nitrogen gas is supplied; supply time is 0.1 sec. Time required for these four steps is 0.9 sec. This is a required time for one cycle. When one cycle was repeated 100 times, a film thickness of 20 Å was achieved. A film thickness of a TaN film formed by one cycle was 0.2 Å. Additionally, time required for 100 times of one cycle was 90 sec. By using the apparatus having a configuration according the above-mentioned embodiment of the present invention, it was seen that extremely high throughput was able to be achieved. Additionally, by using the method according to the above embodiment of the present invention, while achieving extremely high throughput, the film-thickness uniformity was 1.8% at 1 sigma (5 mm edge removed), and the particle level was able to remain as low as 10 pieces or less of particles with 0.16 μm or above (Ø300 mm silicon wafers). This means that even with a short cycle time, remaining reaction gas in each step can be eliminated nearly completely. This was achieved because by minimizing an internal capacity of the dispersion plate 3 and by minimizing a capacity of a space between the dispersion plate 3 and the exhaust duct 4 as much as possible as well as by eliminating areas in which gas flow easily stays, remaining reaction gases were able to be completely eliminated by nitrogen gas purge for a short period of time.

The process according to the present invention can be achieved in the same way in the apparatus having a configuration shown in FIGS. 1C-1E as well.

In this embodiment, a process was conducted using tertiaryamylimidotris(dimethylamido)tantalum: $TaN(C_4H_9)(NC_3H_6)_3$, an organic metal material of Ta, and $NH_3$; source gas valves 531 and 533 were used. After a silicon substrate is transferred from a vacuum transfer chamber (not shown) to the reaction chamber 501, remaining moisture, oxygen, etc. are evacuated sufficiently using a turbo pump 7 (See FIG. 1A). The substrate is moved to a given position by a vertical movement mechanism of the substrate-heating stand 508. At this time, a gap between the dispersion plate 503 and a substrate surface is set at a value within the range of 2-8 mm. In this embodiment, the process was implemented by setting the gap at 5 mm.

FIG. 5 and FIG. 6 show a process sequence: A silicon substrate is transferred from a vacuum transfer chamber (not shown) to the reaction chamber 501. The reaction chamber is exhausted by the turbo pump to $10^{-6}$ Torr or below. After an amount of remaining gases including moisture and oxygen is reduced, the substrate-heating stand 508 is moved upward so that a distance between the dispersion plate 503 and a surface of the silicon substrate placed on the substrate-heating stand 508 becomes 5 mm. Exhausting gases from a transfer-space portion by the turbo pump is switched to by a dry pump (not shown). Additionally, gases inside the reaction chamber are exhausted from an exhaust duct 504 via an exhaust slit 523. At this time, by narrowing a distance between the substrate-heating stand 508 and the exhaust duct 504 by the source-gas diffusion prevention ring, reaction gases are exhausted mostly from the exhaust duct 504. By narrowing the gap between the substrate-heating stand 508 and the exhaust duct 504 and by controlling a pressure in a transfer space by controlling an amount of nitrogen gas introduced into the space, an amount of the reaction gas entering into the transfer-chamber side can be avoided. The substrate-heating stand 508 is controlled so that the substrate is kept at a temperature of 0-400° C.

In Step 1 shown in FIG. 5, in a state in which conductance of the valve 20 is closed, Ta gas is first supplied from a valve 531; supply time is 0.2 sec.

In Step 2, after the valve 531 is closed and conductance of the valve 520 is increased to the maximum, a valve 530 is opened and 2,000 sccm of nitrogen gas is supplied; supply time is 0.1 sec.

In Step 3, the valve 530 is closed, and in a state in which conductance of the valve 520 is closed, $NH_3$ gas is first supplied from a valve 533. At this time, by introducing RF power of 13.56 MHz to the dispersion plate 3 via a RF electrode 525, $NH_3$ gas is excited into plasma; supply time of $NH_3$ is 0.5 sec.

In Step 4, after introducing RF power is stopped and conductance of the valve 520 is increased to the maximum conductance, the valve 530 is opened and 2,000 sccm of nitrogen gas is supplied; supply time is 0.1 sec. Time required for these four steps is 0.9 sec. This is a required time for one cycle. When one cycle was repeated 100 times, a film thickness of 20 Å was achieved. A film thickness of a TaN film formed by one cycle was 0.2 Å. Additionally, time required for 100 times of one cycle was 90 sec. By using the apparatus having a configuration according the above-mentioned embodiment of the present invention, it was seen that extremely high throughput was able to be achieved. Additionally, by using the method according to the above embodiment of the present invention, while achieving extremely high throughput, the film-thickness uniformity was 1.5% at 1 sigma (3 mm edge removed), and the particle level was able to remain as low as 15 pieces or less of particles with 0.16 μm or above (Ø300 mm silicon wafers). This means that even with a short cycle time, remaining reaction gas in each step can be eliminated nearly completely. This was achieved because by minimizing an internal capacity of the dispersion plate 503 and by minimizing a capacity of a space between the dispersion plate 503 and the exhaust duct 504 as much as possible as well as by eliminating areas in which gas flow easily stays, remaining reaction gases were able to be completely eliminated by nitrogen gas purge for a short period of time.

With the above, using the thin-film formation apparatus according to the above-mentioned embodiment of the present invention, it was seen that by forming an exhaust valve capable of being opened/closed at high speed in a shower portion, and as shown in FIGS. 1C-1E by optimizing gas purge from the lower portion of the substrate-heating stand, an exhaust position, and a distance from a substrate edge to the exhaust port, TaN films were able to be formed extremely efficiently, excellent uniformity was achieved while raising throughput as well as reducing particles.

Similarly, an embodiment using the structure shown in FIGS. 1E and 1G is described below. Instead of the source-gas diffusion prevention ring 550, diffusion prevention and exhaust-slit position adjustment rings 556 and 557 (the exhaust ring 556 and gas diffusion prevention ring 557) are used.

Additionally, for the substrate-heating stand 508, a structure having a 20 mm larger diameter than the one shown in FIGS. 1C, and 1F is adopted. As shown in FIG. 1G, in this case, a distance between an edge of the substrate 515 and an edge of the substrate-heating stand is set at 20 mm. Additionally, the position 555 of the exhaust slit (the position in the heating stand side is the same as the position of the exit of the slit 559') is disposed approx. 10 mm below a surface of the substrate-heating stand 508. Additionally, a width between a portion of the ring 556, which is above the exhaust slit position 555, and the substrate-heating stand 508 is set at 3 mm; a width between a portion of the ring 557, which is below the exhaust slit position 555, and the substrate-heating stand 508 is set at 1 mm, and a length is set at 20 mm.

By this, and with setting a distance from an edge of the substrate 515 to the exhaust port 555 at approx. 30 mm and with an effect of inert-gas purge from the space 554 being discharged from the exhaust port 555 without being discharged to a surface of the substrate-heating stand 508, a drop in surface concentration of a source gas at an edge of the substrate 515 was suppressed, and for both sheet resistance uniformity and film-thickness uniformity of WNC films, 0.9% at 1 sigma (300 mm; 3 mm edge removed; 49-point measurement) was able to be achieved.

With the above, using the thin-film formation apparatus according to the above-mentioned embodiment of the present invention, by forming an exhaust valve capable of being opened/closed at high speed in a shower portion, it was shown that TaN films were able to be formed extremely efficiently, and as shown in FIGS. 1C-1E by optimizing gas purge from the lower portion of the substrate-heating stand, an exhaust position, and a distance from a substrate edge to the exhaust port, excellent uniformity was achieved while raising throughput as well as reducing particles.

Using the thin-film formation apparatus according to the above-mentioned embodiment of the present invention, it was seen that TaN films were able to be formed extremely efficiently.

Additionally, the downstream exhaust mechanism shown in FIGS. 1F and 1G is adopted preferably in combination of the upstream exhaust mechanism described above; however, not applying only to it, it can be adopted in thin-film formation apparatuses without possessing the upstream exhaust mechanism, or in thin-film formation apparatuses possessing upstream exhaust mechanisms different from the above-mentioned upstream exhaust mechanism, and desired effects can be achieved.

For example, a thin-film formation apparatus can comprise (A) a reaction chamber to be evacuated, (B) a placing portion disposed inside the reaction chamber, on which a substrate is placed. (C) a gas-dispersion guide being disposed above the placing portion and used for supplying a gas onto a substrate surface, (D) a gas-supply port for introducing a gas into the gas-dispersion guide, (E) a gas-dispersion plate being disposed on the substrate side of the gas-dispersion guide and having multiple gas discharge pores, (F) an exhaust port for exhausting a gas, which is supplied from the gas-dispersion plate to the substrate surface, radially from the perimeter of the placing stand, and (G) a purge-gas ring disposed concentrically with the placing stand at a certain distance apart from the side of the placing stand, in which the purge-gas slit is formed by the side of the placing stand and the purge-gas ring, and a gas flow path being communicatively connected with the exhaust port by way of a lower space below the placing stand and the slit. This embodiment further includes the following aspects:

The thin-film formation apparatus, wherein a thickness of the purge-gas slit is approx. 0.5 mm to approx. 1.5 mm; a length in the placing stand's axial direction is approx. 15 mm to approx. 40 mm.

The thin-film formation apparatus, wherein as an entrance of the exhaust port, an annular slit is disposed concentrically and on the outer side of the placing stand and practically and approximately in the same position as that of a substrate-placing surface of the placing stand.

The thin-film formation apparatus, wherein the purge-gas ring is provided on the lower side than the substrate-placing surface on the side of the placing stand; with the exhaust ring being disposed above the purge-gas ring along and concentrically with the side of the placing stand, the exhaust slit is formed between the purge-gas ring and the side of the placing stand; the annular slit is disposed as an entrance of the exhaust port between the exhaust ring and the purge-gas ring.

The thin-film formation apparatus, wherein a thickness of the exhaust slit is larger than a thickness of the purge-gas slit.

The thin-film formation apparatus, wherein a thickness of the exhaust slit is approx. 2 mm to approx. 4 mm.

Further, the above-mentioned embodiment is applicable to a method, for example, a thin-film formation method comprising the steps of: (A) placing a substrate on a placing portion inside a reaction chamber to be evacuated, (B) introducing a gas to a gas-dispersion guide installed above the placing portion from a gas-supply port, (C) supplying a gas to a substrate surface via a gas-dispersion plate being disposed on the substrate side of the gas-dispersion guide and having multiple gas discharge pores, (D) exhausting the gas, which was supplied to the substrate surface from the gas-dispersion plate, from an exhaust port provided annularly around the placing stand, and (E) suppressing diffusion of the gas to a lower space below the placing stand by introducing a purge gas from the lower space below the placing stand by way of a purge-gas slit, which is created by a purge-gas ring disposed concentrically a certain distance apart from the side of the placing stand and the side of the placing stand, and exhausting the purge gas from the exhaust port.

The above-mentioned method includes the following aspects:

The method, wherein purge gas is introduced by setting a thickness of the purge-gas slit at approx. 0.5 mm to approx. 1.5 mm and a length of the placing stand's axial direction at approx. 15 mm to approx. 40 mm.

The method, wherein a gas is exhausted by disposing an annular slit concentrically on the outer side of the placing stand, and practically and approximately in the same position as that of a substrate-placing surface of the placing stand.

The method, wherein gases are exhausted by forming a exhaust slit between a purge-gas ring and the side of the placing stand by providing the purge-gas ring on the side of the placing stand and below a substrate surface, and by disposing an exhaust ring above the purge-gas ring along and concentrically with the side of the placing stand; and by disposing an annular slit as an entrance of the exhaust port between the exhaust ring and the purge-gas ring.

The method, wherein gases are exhausted by setting a thickness of the exhaust slit at a larger value than a thickness of the purge-gas slit.

The method, wherein gases are exhausted by setting a thickness of the exhaust slit at approx. 2 mm to approx. 4 mm.

Each factor in various aspects of the above-mentioned apparatus and method can be mutually replaced, and can be implemented by combining them appropriately.

The present invention includes, but is not limited to the following aspects; and applies to methods as well as to apparatuses:

1) A thin-film formation apparatus which is characterized in that possessing a reaction chamber to be evacuated, and inside the reaction chamber, a placing portion for placing a substrate thereon, a gas-dispersion guide for supplying a gas onto a surface of the substrate placed on the placing portion, a gas-dispersion plate (equivalent to a showerhead) having a supply port for introducing the gas into the gas-dispersion guide and multiple gas-discharge ports provided on the substrate side of the gas-dispersion guide, a first exhaust port for exhausting the gas supplied onto the substrate surface from the gas-dispersion plate, and a second exhaust port for exhausting gas the inside of the gas-dispersion guide being provided between the gas-supply port and the gas-dispersion plate.

2) The thin-film formation apparatus according to 1) above, which is characterized in that exhaust ports or an exhaust slit is formed between the gas-dispersion plate having multiple gas-discharge pores and a gas-supply port in the gas-dispersion guide, and enclosing the perimeter of the gas-dispersion plate; a gas exhausted from these exhaust pores or the exhaust slit, which the gas is introduced into the gas-dispersion guide, gets through the second exhaust port by way of a space adjacent to an external wall of a gas-dispersion guide wall, which establishes an area the gas goes through before reaching the exhaust pores or the slit.

3) The thin-film formation apparatus according to 2) above, which is characterized in that the space communicatively connected with the exhaust pores or the exhaust slit is communicatively connected with the space enclosing the gas-supply port, from which a valve serving as a second exhaust port is connected to an exhaust system.

4) The thin-film formation apparatus according to 3) above, which is characterized in that the valve connected to the exhaust system has a feature of enabling variable exhaust conductance and controlling the minimum conductance at 1% or below of the maximum conductance.

5) The thin-film formation apparatus according to 3) or 4) above, which is characterized by comprising the steps of introducing a first gas into the gas-dispersion apparatus from the gas-supply port, during which the valve connected to the exhaust system is closed or conductance is controlled at 1% or below of the maximum conductance; supplying the first gas onto a surface of the substrate after the first gas going through the dispersion plate; after stopping supplying the first gas, opening the valve connected to the exhaust system and exhausting gases inside the dispersion apparatus, introducing a second gas from the gas-supply port; shutting supplying the second gas after a given period of time; after closing the valve connected to the exhaust system or controlling conductance at 1% or below of the maximum conductance, supplying a third gas from the gas-supply port; after a given period of time, and after stopping supplying the third gas, opening the valve connected to the exhaust system and exhausting gases inside the dispersion apparatus, introducing the second gas from the gas-supply port; shutting off supplying the second gas after a given period of time; or that repeating these steps the several number of times.

6) The thin-film formation apparatus according to 3) or 4) above, which is characterized by comprising the steps of introducing a first gas from the gas-supply port to the gas-dispersion apparatus, during which the valve connected to the exhaust system is closed or conductance is controlled at 1% or below of the maximum conductance; supplying a first gas onto a surface of the substrate after the first gas going through the dispersion plate; after stopping supplying the first gas, opening the valve connected to the exhaust system, and exhausting gases inside the dispersion apparatus, introducing a second gas from the gas-supply port; shutting off supplying the second gas after a given period of time; after closing the valve connected to the exhaust system or controlling conductance at 1% or below of the maximum conductance, supplying a third gas from the gas-supply port; after a given period of time, stopping supplying the third gas, closing the valve connected to the exhaust system or controlling conductance at 1% or below of the maximum conductance, and exhausting gases inside the dispersion apparatus; introducing the second gas from the gas-supply port; shutting off supplying the second gas after a given period of time; after closing the valve connected to the exhaust system or controlling conductance at 1% or below of the maximum conductance, supplying a fourth gas from the gas-supply port; after a given period of time, shutting off supplying the fourth gas; after closing the valve connected to the exhaust system or controlling conductance at 1% or below of the maximum conductance, and exhausting gases inside the dispersion apparatus, introducing the second gas from the gas-supply port; shutting off supplying the second after a given period of time; or that repeating these steps the several number of times.

7) The thin-film formation apparatus according to 3) or 4) above, which is characterized by comprising the steps of introducing a first gas into the gas-dispersion apparatus from the gas-supply port, during which the valve connected to the exhaust system is closed or conductance is controlled at 1% or below of the maximum conductance; supplying a first gas onto a surface of the substrate after the first gas going through the dispersion plate; after stopping supplying the first gas and opening the valve connected to the exhaust system, introducing a second gas from the gas-supply port; shutting supplying the second gas after a given period of time; after closing the valve connected to the exhaust system or controlling conductance at 1% or below of the maximum conductance, supplying a third gas from the gas-supply port; after a given period of time, stopping supplying the third gas; opening the valve connected to the exhaust system and introducing the second gas from the gas-supply port; or that repeating these steps the several number of times.

8) The thin-film formation apparatus according to 3) or 4) above, which is characterized by comprising the steps of introducing a first gas from the gas-supply port to the gas-dispersion apparatus, during which the valve connected to the exhaust system is closed or conductance is controlled at 1% or below of the maximum conductance; supplying the first gas onto a surface of the substrate after the first gas going through the dispersion plate; after stopping supplying the first gas and opening the valve connected to the exhaust system, introducing a second gas from the gas-supply port; shutting off supplying the second gas after a given period of time; after closing the valve connected to the exhaust system or controlling conductance at 1% or below of the maximum conductance, supplying a third gas from the gas-supply port; after a given period of time, stopping supplying the third gas and opening the valve connected to the exhaust system, introducing the second gas from the gas-supply port; shutting off supplying the second gas after a given period of time; after closing the valve connected to the exhaust system or controlling conductance at 1% or below of the maximum conductance, supplying a fourth from the gas-supply port; after a given period of time, shutting off supplying the fourth gas and opening the valve connected to the exhaust system; introducing the second gas from the gas-supply port; shutting off supplying the second after a given period of time; or that repeating these steps the several number of times.

9) The thin-film formation apparatus according to any of 1) to 8) above, which is characterized by applying RF power to the gas-dispersion plate.

10) The thin-film formation apparatus according to any of 1) to 8) above, which is characterized in that RF power is applied to a wall comprising the gas-dispersion guide, which the wall controls a space that a gas introduced from a gas-introduction port of the gas-dispersion mechanism goes through before reaching an exhaust port communicatively connected with a second exhaust port or an exhaust slit.

11) The thin-film formation apparatus according to any of 1) to 10) above, which is characterized in that a heating source is provided in the gas-dispersion plate to heat the gas-dispersion plate.

12) The thin-film formation apparatus according to any of 1) to 10) above, which is characterized in that a heating source is provided on a wall dividing a space which a gas introduced from the gas-introduction port to the gas-dispersion guide goes through before reaching the gas-dispersion plate to heat the wall.

13) The thin-film formation apparatus according to 12) above, which is characterized in that the wall dividing the space which a gas introduced from the gas-introduction port to the gas-dispersion guide goes through before reaching the gas-dispersion plate is controlled at a temperature within the range of 50-450° C. and other portions are controlled at a temperature of 250° C. or below.

14) The thin-film formation apparatus according to any of 1) to 13) above, which is characterized in that a portion having a second gas-dispersion feature is provided between the gas-dispersion plate and the gas-introduction port.

15) The thin-film formation apparatus according to 14) above, which is characterized in that the portion having a second gas-dispersion feature is provided to hide the gas-supply port from the substrate side; a gas introduced from the gas-supply port is dispersed toward an edge of the dispersion plate.

16) The thin-film formation apparatus according to 15) above, which is characterized in that a surface facing the gas-supply port of the portion having the dispersion mechanism is covered; in a direction vertical to this surface, the gas-discharge port is formed.

17) The thin-film formation apparatus according to 14) above, which is characterized in that the portion having the second gas-dispersion feature is provided in parallel to the dispersion plate and having a gas-discharge port in a position not overlapping with the gas-discharge port of the gas-dispersion plate.

18) The thin-film formation apparatus according to any of 3) to 17) above, which is characterized in that conductance of the valve connected to the exhaust system is adjusted to at least approx. 10 times to approx. 1,000 times conductance of the gas-dispersion plate when the exhaust system is opened at maximum, and to approx. 0.001 times to approx. 0.1 time or below conductance of the gas-dispersion plate when conductance of the valve connected to the exhaust system becomes minimum.

19) The thin-film formation apparatus according to any of 3) to 18) above, which is characterized in that being adapted that a source gas discharged from the gas-dispersion plate does not pass around to the lower portion of the placing stand by way of the side portion of the placing stand by disposing a ring for source-gas diffusion prevention around the placing stand at a certain distance (a distance with the side portion is minimum, e.g., a width of approx. 1 mm) apart from the side of the placing stand and concentrically with the placing stand, and by introducing an inert gas from below the placing stand to the upper side by way of a slit having the given distance as its thickness.

20) The thin-film formation apparatus according to 19) above, which is characterized in that an annular slit being provided in the further outer circumference of an upper edge of the exhaust ring.

21) The thin-film formation apparatus according to any of 1) to 18) above, which is characterized in that by disposing a ring for source-gas diffusion prevention around the placing stand at a certain distance (a distance with the side portion is minimum, e.g., a width of approx. 1 mm) apart from the side of the placing stand, concentrically with the placing stand with an upper edge of the ring being disposed lower than an edge of the top surface of the placing stand, providing the exhaust ring concentrically along the vicinity of the upper edge of the ring to the side portion of the placing stand, and forming annular exhaust slit in a gap between the source-gas diffusion prevention ring and the exhaust ring, the thin-film formation apparatus is adapted that a source gas discharged from the gas-dispersion plate does not pass around to the lower portion of the placing stand by way of the side portion of the placing stand by introducing an inert gas from below the placing stand to the upper side by way of a slit formed between the source-gas diffusion prevention ring and the side portion of the placing stand.

22) The thin-film formation apparatus according to 21) above, which is characterized in that the gap between the source-gas diffusion prevention ring and the side portion of the placing stand is narrower than the gap formed between the exhaust ring and the side portion of the placing stand.

23) The thin-film formation apparatus according to 3) above, which is characterized in that exhaust conductance of a valve connected to the exhaust system is 30 litter/sec or above.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A thin-film formation apparatus comprising:
 a reaction chamber to be evacuated;
 a placing portion for placing a substrate thereon inside said reaction chamber;
 a gas-dispersion guide disposed above said placing portion for supplying a gas onto a surface of said substrate;
 a gas-supply port for introducing a gas into said gas-dispersion guide;
 a gas-dispersion plate disposed on a substrate side of said gas-dispersion guide and having multiple gas discharge pores;
 a first exhaust port for exhausting, downstream of said gas-dispersion plate, the gas supplied onto the substrate surface; and
 a second exhaust port for exhausting, upstream of said gas-dispersion plate, a gas inside said gas-dispersion guide through a gap between said gas-dispersion guide and said gas-dispersion plate.

2. The thin-film formation apparatus according to claim 1, wherein a first gas flow path is formed by communicatively connecting an internal space of said gas-dispersion guide, a space between said gas-dispersion guide and said gas-dispersion plate, and a space between said gas-dispersion plate and a substrate with the first exhaust port; a second gas flow path is formed by communicatively connecting the internal space of said gas-dispersion guide, the space between said gas-dispersion guide and said gas-dispersion plate, and a space facing an outer circumferential wall of said gas-dispersion guide with the second exhaust port.

3. The thin-film formation apparatus according to claim 2, wherein in said second gas flow path, the space between said gas-dispersion guide and said gas-dispersion plate and the space facing the outer circumferential wall of said gas-dispersion guide are communicated with each other via an exhaust pore or an annular exhaust slit provided between an outer circumferential rim of said gas-dispersion guide and an outer circumferential portion of said gas-dispersion plate.

4. The thin-film formation apparatus according to claim 1, wherein said gas-dispersion guide has a truncated cone shape extending downward and being open at its lower side.

5. The thin-film formation apparatus according to claim 1, wherein said gas-dispersion guide further comprises an intermediate dispersion element having pores or slits for discharging a gas toward said gas-dispersion plate in the vicinity of said gas-supply port.

6. The thin-film formation apparatus according to claim 1, wherein a valve connected to an external exhaust system is connected to said second exhaust port.

7. The thin-film formation apparatus according to claim 6, wherein said valve is a valve having exhaust conductance which is variable at high speed of 100 msec or less.

8. The thin-film formation apparatus according to claim 7, wherein said valve's minimum conductance is controlled at 1% or less of said valve's maximum conductance.

9. The thin-film formation apparatus according to claim 7, which is configured to exhaust the gas predominantly from said second gas flow path when said valve's conductance is maximum; and exhaust the gas predominantly from said first gas flow path when said valve's conductance is minimum.

10. The thin-film formation apparatus according to claim 1, wherein an electrode for applying RF power is further provided in said gas-dispersion plate.

11. The thin-film formation apparatus according to claim 1, wherein an electrode for applying RF power is further provided on a wall constituting said gas-dispersion guide.

12. The thin-film formation apparatus according to claim 1, wherein a heating source for heating a gas passing through said gas-dispersion plate is further installed in said gas-dispersion plate.

13. The thin-film formation apparatus according to claim 1, wherein a heating source for heating a gas inside said gas-dispersion guide is further installed in a wall constituting said gas-dispersion guide.

14. The thin-film formation apparatus according to claim 13, wherein a temperature of said wall is controlled within the range of 50° C.-450° C., and a temperature of said gas-dispersion plate is controlled at 250° C. or below.

15. The thin-film formation apparatus according to claim 1, wherein said gas-dispersion guide further comprises an intermediate plate between said gas-dispersion plate and said gas-supply port, wherein said intermediate plate has intermediate gas-discharge pores in positions not overlapping with said gas-discharge pores of said gas-dispersion plate and functions as a second dispersion plate.

16. The thin-film formation apparatus according to claim 6, wherein said valve is configured to have conductance controlled to be approx. 10 times to approx. 1,000 times conductance of said dispersion plate when said valve is opened at maximum; and have conductance of said valve controlled to be approx. 0.001 times to approx. 0.1 times conductance of said dispersion plate when conductance of said valve is at minimum.

17. The thin-film formation apparatus according to claim 6, wherein exhaust conductance of said exhaust valve is 30 liter/sec when said exhaust valve is opened at maximum.

18. The thin-film formation apparatus according to claim 2, wherein a purge-gas ring is disposed concentrically with said placing stand at a given distance apart from a side portion of said placing stand; a slit is constituted by the side portion of said placing stand and said purge-gas ring; and a third gas flow path is formed by communicatively connecting a lower space below said placing stand with the first exhaust port via said slit.

19. The thin-film formation apparatus according to claim 18, wherein said purge-gas slit has a thickness of approx. 0.5 mm to approx. 1.5 mm and a length of approx. 15 mm to approx. 40 mm in said placing stand's axial direction.

20. The thin-film formation apparatus according to claim 18, wherein an annular slit is disposed, as an entrance of the first exhaust port, concentrically outside said. placing stand and substantially and nearly at the same level as that of a substrate-placing surface of the placing stand.

21. The thin-film formation apparatus according to claim 18, wherein said purge-gas ring is provided around the side portion of said placing stand at a lower position than the substrate-placing surface; and an exhaust ring is disposed above said purge-gas ring along and concentrically with the side portion of said placing stand, thereby constituting an exhaust slit which is an annular slit disposed as an entrance of said exhaust port between said exhaust ring and said purge-gas ring.

22. The thin-film formation apparatus according to claim 21, wherein said exhaust slit has a thickness larger than a thickness of said purge-gas slit.

23. The thin-film formation apparatus according to claim 22, wherein said exhaust slit has a thickness of approx. 2 mm to approx. 4 mm.

24. A thin-film formation apparatus comprising:

a reaction chamber to be evacuated;

a placing portion on which a substrate is placed inside said reaction chamber;

a gas-dispersion guide installed above said placing portion for supplying a gas onto a surface of said substrate;

a gas-supply port for introducing a gas into said gas-dispersion guide, a gas-dispersion plate being disposed on a substrate side of said gas-dispersion guide and having multiple gas discharge pores;

an exhaust port for exhausting a gas supplied from said gas-dispersion plate to the substrate surface radially from a perimeter of a placing stand; and a purge-gas ring disposed concentrically and at a given distance apart from a side portion of said placing stand, wherein a purge-gas slit is constituted by the side portion of said placing stand and said purge-gas ring, and a gas flow path is constituted by communicatively connecting said exhaust port with a lower space below said placing stand via said purge-gas slit.

25. The method according to claim 24, wherein said purge-gas slit has a thickness of approx. 0.5 mm to approx. 1.5 mm and a length of approx. 15 mm to approx. 40 mm in said placing stand's axial direction.

26. The method according to claim 24, wherein an annular slit is disposed, as an entrance of said exhaust port, concentrically outside said placing stand and substantially and nearly at the same level as that of a substrate-placing surface of said placing stand.

27. The method according to claim 24, wherein said purge-gas ring is provided around the side portion of said placing stand at a lower position than the substrate-placing surface; and an exhaust ring is disposed above said purge-gas ring along and concentrically with the side portion of said placing stand, thereby constituting an exhaust slit which is an annular slit disposed as an entrance of said exhaust port between said exhaust ring and said purge-gas ring.

28. The method according to claim 27, wherein said exhaust slit has a thickness larger than a thickness of said purge-gas slit.

29. The method according to claim 28, wherein said exhaust slit has a thickness of approx. 2 mm to approx. 4 mm.

* * * * *